(12) United States Patent
Aoki et al.

(10) Patent No.: US 9,101,079 B2
(45) Date of Patent: Aug. 4, 2015

(54) COOLING UNIT AND ELECTRONIC EQUIPMENT

(71) Applicant: FUJITSU LIMITED, Kawasaki-shi, Kanagawa (JP)

(72) Inventors: Nobumitsu Aoki, Kawasaki (JP); Takeshi Nishiyama, Kawasaki (JP); Takashi Urai, Kawasaki (JP); Masumi Suzuki, Kawasaki (JP); Michimasa Aoki, Kawasaki (JP); Jie Wei, Hachioji (JP); Fumihiro Tawa, Yokohama (JP); Yoshinori Uzuka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 230 days.

(21) Appl. No.: 13/969,061

(22) Filed: Aug. 16, 2013

(65) Prior Publication Data
US 2014/0071624 A1  Mar. 13, 2014

(30) Foreign Application Priority Data
Sep. 7, 2012  (JP) .................................. 2012-197923

(51) Int. Cl.
*H05K 7/20* (2006.01)
*F28D 15/00* (2006.01)
(Continued)

(52) U.S. Cl.
CPC ............ *H05K 7/20263* (2013.01); *F28D 15/00* (2013.01); *F28F 7/00* (2013.01);
(Continued)

(58) Field of Classification Search
CPC . H05K 7/20; H05K 7/20263; H05K 7/20272; H05K 7/20309; H05K 23/34; H05K 23/473; H05K 23/4735; H05K 5/00; G06F 1/20; F28F 9/00; F28F 1/00; F28D 7/02; F28D 7/12; F24F 7/00; F24F 1/025; F24F 13/02; F24D 15/00

USPC ............ 361/679.46, 679.53, 679.54, 679.55, 361/688, 689, 698, 699, 701, 702, 703, 174, 361/715, 719–727; 257/713–718, 722–724; 174/15.1, 16.3; 62/64, 259.2, 376, 175, 62/59, 199; 454/184; 165/80.2, 80.4, 80.5, 165/104.14, 104.19, 104.31, 104.33, 165/104.34, 121–126, 185

See application file for complete search history.

(56) References Cited

U.S. PATENT DOCUMENTS

| | | | | |
|---|---|---|---|---|
| 4,977,444 | A * | 12/1990 | Nakajima et al. | ............. 257/714 |
| 6,828,675 | B2 * | 12/2004 | Memory et al. | ............... 257/714 |

(Continued)

FOREIGN PATENT DOCUMENTS

| | | |
|---|---|---|
| JP | 1-130825 | 9/1989 |
| JP | 5-1921 | 1/1993 |

(Continued)

OTHER PUBLICATIONS

Korean Office Action mailed Aug. 26, 2014 for corresponding Korean Patent Application No. 10-2013-0098407, with English Translation, 11 pages.

*Primary Examiner* — Michail V Datskovskiy
(74) *Attorney, Agent, or Firm* — Fujitsu Patent Center

(57) ABSTRACT

A cooling unit includes a radiator, a rigid supply pipe connected to the radiator, and a refrigerant that is air-cooled by the radiator flows, a plurality of open nozzles provided at the supply pipe to correspond to the respective plurality of heat-generating components, a plurality of heat receiving units that are mounted to the respective plurality of heat-generating components and connected to the respective open nozzles, and allow a refrigerant supplied from the open nozzles to flow through internal channels, and a plurality of return pipes each of which is provided for each of the heat receiving units and joined to the heat receiving unit, and returns the refrigerant discharged from the heat receiving unit to the radiator, wherein the respective heat receiving units are connected to the supply pipe to be relatively displaceable, and the respective return pipes are connected to one another in series and relatively displaceably.

12 Claims, 19 Drawing Sheets

(51) Int. Cl.
  *H01L 23/34* (2006.01)
  *H01L 23/467* (2006.01)
  *H01L 23/473* (2006.01)
  *F28F 7/00* (2006.01)

(52) U.S. Cl.
  CPC ............. *H01L 23/34* (2013.01); *H01L 23/467* (2013.01); *H01L 23/473* (2013.01); *H05K 7/20272* (2013.01); *H01L 2924/0002* (2013.01)

(56) References Cited

U.S. PATENT DOCUMENTS

| | | | |
|---|---|---|---|
| 6,967,842 B2 * | 11/2005 | Aoki et al. | 361/701 |
| 6,997,247 B2 * | 2/2006 | Malone et al. | 165/150 |
| 7,002,799 B2 * | 2/2006 | Malone et al. | 361/699 |
| 7,057,893 B2 * | 6/2006 | Nicolai et al. | 361/699 |
| 7,149,084 B2 * | 12/2006 | Matsushima et al. | 361/699 |
| 7,187,549 B2 * | 3/2007 | Teneketges et al. | 361/699 |
| 7,203,063 B2 * | 4/2007 | Bash et al. | 361/699 |
| 7,280,358 B2 * | 10/2007 | Malone et al. | 361/701 |
| 7,333,334 B2 * | 2/2008 | Yamatani et al. | 361/701 |
| 7,372,698 B1 * | 5/2008 | Tilton et al. | 361/701 |
| 7,551,440 B2 * | 6/2009 | Belady et al. | 361/699 |
| 7,639,499 B1 * | 12/2009 | Campbell et al. | 361/699 |
| 8,289,710 B2 * | 10/2012 | Spearing et al. | 361/701 |
| 8,596,338 B2 * | 12/2013 | Chen et al. | 165/80.4 |
| 8,922,998 B2 * | 12/2014 | Campbell et al. | 361/699 |
| 2003/0057546 A1 * | 3/2003 | Memory et al. | 257/706 |
| 2004/0250992 A1 | 12/2004 | Aoki et al. | |
| 2005/0180107 A1 | 8/2005 | Naganawa et al. | |
| 2005/0241803 A1 | 11/2005 | Malone et al. | |
| 2006/0002080 A1 | 1/2006 | Leija et al. | |
| 2007/0125523 A1 | 6/2007 | Bhatti et al. | |
| 2011/0075373 A1 * | 3/2011 | Campbell et al. | 361/701 |

FOREIGN PATENT DOCUMENTS

| | | |
|---|---|---|
| JP | 5-136586 | 6/1993 |
| JP | 8-186388 | 7/1996 |
| JP | 2002-335091 | 11/2002 |
| JP | 2004-363308 A | 12/2004 |
| JP | 2005-229030 A | 8/2005 |
| JP | 2005-326141 | 11/2005 |
| JP | 2007-241991 | 9/2007 |
| JP | 2008-500738 | 1/2008 |
| JP | 2008-287733 | 11/2008 |
| JP | 3146845 U | 12/2008 |
| KR | 10-2005-0081841 A | 8/2005 |

* cited by examiner

COOLING UNIT AND ELECTRONIC EQUIPMENT

CROSS-REFERENCE TO RELATED APPLICATION

This application is based upon and claims the benefit of priority of the prior Japanese Patent Application No. 2012-197923, filed on Sep. 7, 2012, the entire contents of which are incorporated herein by reference.

FIELD

The present invention relates to a cooling unit and electronic equipment.

BACKGROUND

Conventionally, various cooling modules have been proposed, which cool heat-generating components that generate heat, such as a central processing unit (CPU: Central Processing Unit), in electronic equipment such as a server (for example, refer to Patent documents 1 to 5 and the like). As one example, a cooling module is known, which circulates a cooling liquid in a circulation passage by a pump, causes the cooling liquid to absorb generated heat of a heat-generating component by a cooling jacket that is fitted to the heat-generating component, and air-cools the cooling liquid by heat radiation from a radiator. In electronic equipment, a plurality of heat-generating components are often mounted on a circuit board, and unitization of the cooling module is sometimes performed by fitting a cooling jacket to each of a plurality of heat-generating components.

[Patent document 1] Japanese Patent Laid-Open No. 2002-335091
[Patent document 2] Japanese Patent Laid-Open No. 2008-287733
[Patent document 3] Japanese Patent Laid-Open No. 2005-326141
[Patent document 4] Japanese National Publication of International Patent Application No. 2008-500738
[Patent document 5] Japanese Patent Laid-Open No. 2007-241991
[Patent document 6] Japanese Utility Model Laid-Open No. 1-130825
[Patent document 7] Japanese Utility Model Laid-Open No. 5-1921
[Patent document 8] Japanese Patent Laid-Open No. 5-136586
[Patent document 9] Japanese Patent Laid-Open No. 8-186388

SUMMARY

A cooling unit needs to have portability, that is, easiness in handling (carrying) when the cooling unit is assembled into a casing (housing) of electronic equipment as a unit. Accordingly, the cooling unit needs a certain degree of rigidity so as to be able to keep the posture, the shape, the form and the like as the entire cooling unit when the cooling unit is handled by an operator. As a method for securing easiness in handling, the methods are conceivable, which use a metallic pipe having high rigidity for the circulation passage of a cooling unit, and rigidly joint the joints of the respective members by brazing (soldering) or the like.

However, when the circulation passage of a cooling unit is simply formed by a metallic pipe, and the respective joints are simply rigidly joined, stress is sometimes applied onto the circulation passage and the joints between the respective members of the cooling unit which is fixed to the casing and the circuit board of electronic equipment, due to dimensional tolerance of the cooling unit. In particular, when a plurality of heat-generating components are mounted on the circuit board of the electronic equipment, variations easily occur to the top surface heights of the heat-generating components in accordance with the heat-generating components, and the dimensional precision that is needed at the time of manufacturing the cooling unit becomes higher. In that case, stress easily concentrates on the circulation passage and the joints between the respective members in the cooling unit, and deterioration and breakage of the members included in the cooling unit are likely to occur. Further, as a result, the cooling liquid in the circulation passage leaks outside, which is likely to cause a failure of the electronic equipment and affect the reliability of the quality.

According to one aspect of the embodiments, a cooling unit that cools a plurality of heat-generating components in electronic equipment, and includes a radiator, a supply pipe which is connected to the radiator, and in which a refrigerant that is air-cooled by the radiator flows, a plurality of open nozzles provided at the supply pipe to correspond to the respective plurality of heat-generating components, a plurality of heat receiving units that are mounted to the respective plurality of heat-generating components and connected to the respective open nozzles, and allow a refrigerant supplied from the open nozzles to flow through internal channels, and a plurality of return pipes each of which is provided for each of the heat receiving units and joined to the heat receiving unit, and returns the refrigerant discharged from the heat receiving unit to the radiator, wherein the respective heat receiving units are connected to the supply pipe to be relatively displaceable, and the respective return pipes are connected to one another in series and relatively displaceably.

According to one aspect of the embodiments, an electronic equipment includes a plurality of heat-generating components, and a cooling unit that cools the plurality of heat-generating components, wherein the cooling unit has a radiator, a supply pipe which is connected to the radiator, and in which a refrigerant that is air-cooled by the radiator flows, a plurality of open nozzles provided at the supply pipe to correspond to the respective plurality of heat-generating components, a plurality of heat receiving units that are mounted to the respective plurality of heat-generating components and connected to the respective open nozzles, and allow a refrigerant supplied from the open nozzles to flow through internal channels, and a plurality of return pipes each of which is provided for each of the heat receiving units and joined to the heat receiving unit, and returns the refrigerant discharged from the heat receiving unit to the radiator, the respective heat receiving units are connected to the supply pipe to be relatively displaceable, and the respective return pipes are connected to one another in series and relatively displaceably.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, a cooling unit according to embodiments and electronic equipment including the cooling unit will be illustratively described in detail, with reference to the drawings.

Embodiment 1

Figure 1:
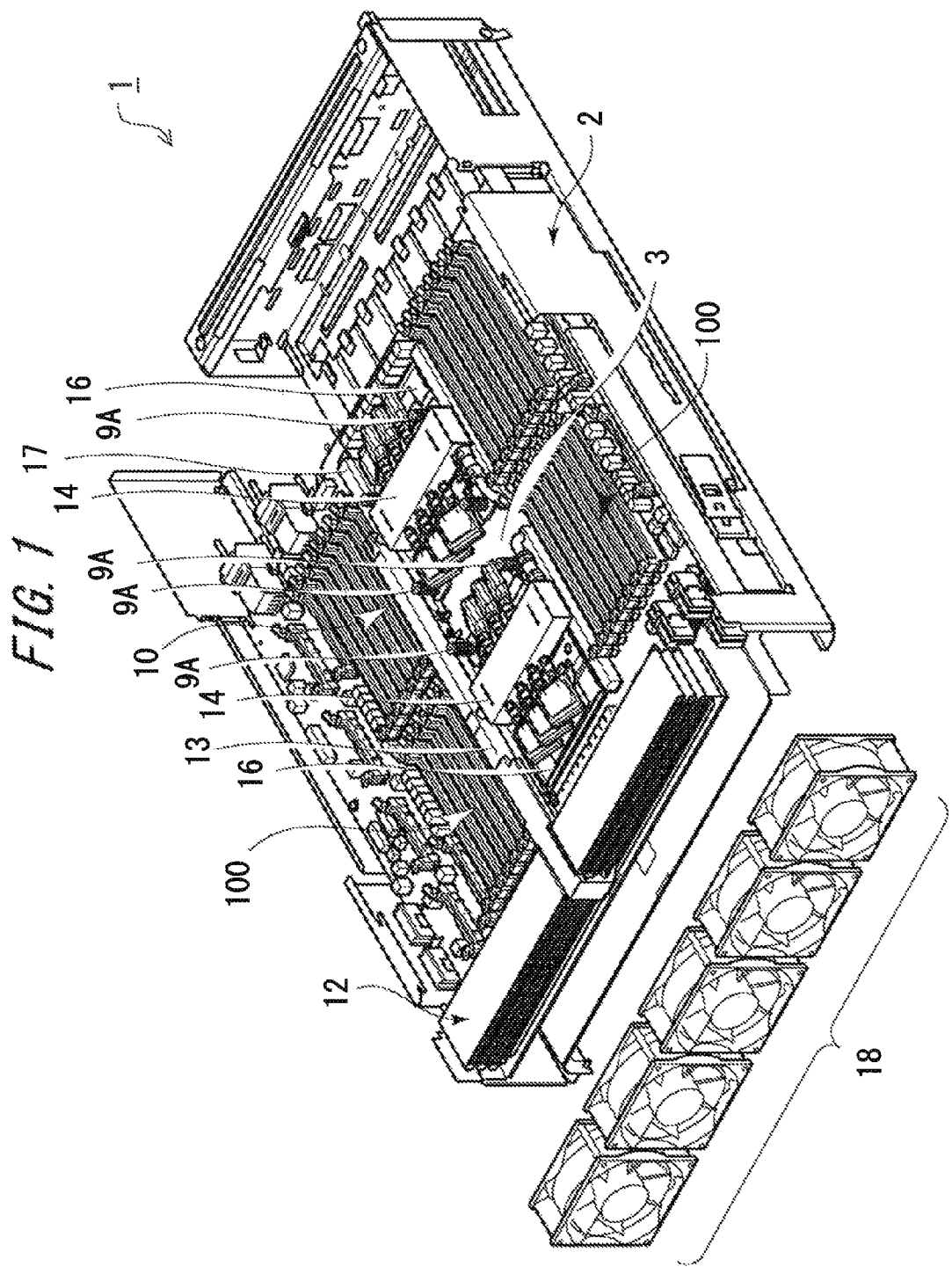
FIG. 1 is a perspective view of electronic equipment according to embodiment 1.
Figure 2:
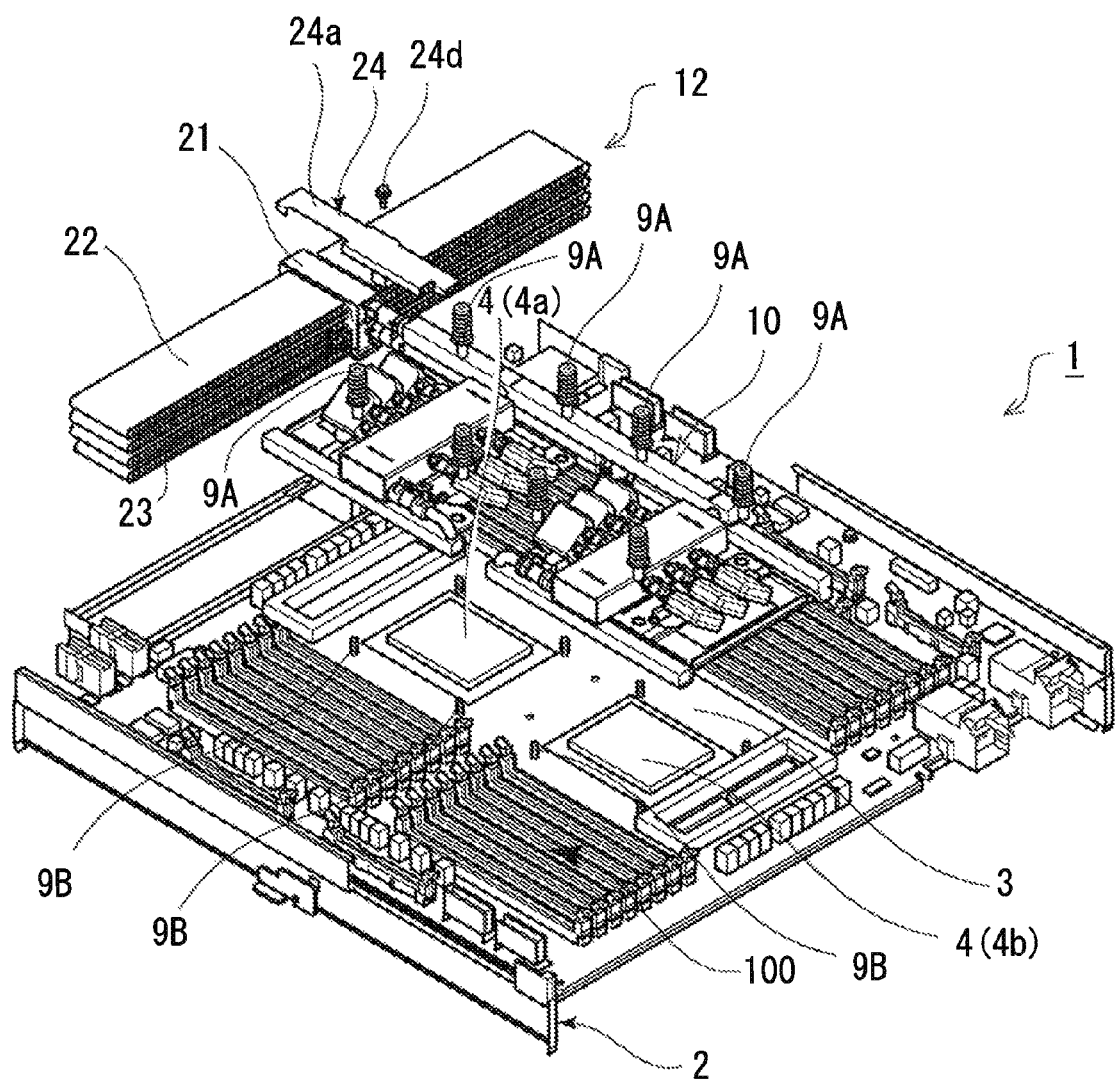
FIG. 2 is an exploded perspective view of the electronic equipment according to embodiment 1.

FIG. 1 is a perspective view of electronic equipment according to embodiment 1. FIG. 2 is an exploded perspective view of the electronic equipment according to embodiment 1. In FIG. 1 and FIG. 2, electronic equipment 1 is information processing equipment such as a server. However, the electronic equipment 1 may be different information processing equipment. The electronic equipment 1 has a casing (housing) 2, and inside the casing 2, a mother board (circuit board) 3 loaded with a plurality of central processing units (CPU: Central Processing Unit) 4 (refer to FIG. 2) is included. The CPU 4 is a device that executes various kinds of calculation, and is an electronic component (heat-generating component) that generates heat by being supplied with electric power. The mother board 3 is a board that is loaded with various circuits for the electronic equipment 1 to implement functions as a server. Further, the casing 2 in FIG. 1 illustrates a part of the housing of the electronic equipment 1, and for example, another metal sheet may be disposed to cover an outer side of the casing 2 which is illustrated. The electronic equipment 1 according to the present embodiment 1 includes a water cooling type cooling unit (cooling module) 10 for cooling a plurality of CPUs 4 which are loaded on the mother board 3 in the casing 2 as the heat-generating components. FIG. 1 illustrates a state in which the cooling unit 10 is mounted to the casing 2 of the electronic equipment 1, whereas FIG. 2 illustrates a state immediately before the cooling unit 10 is built into the casing 2. Hereinafter, details of the cooling unit 10 will be described.

Figure 3:
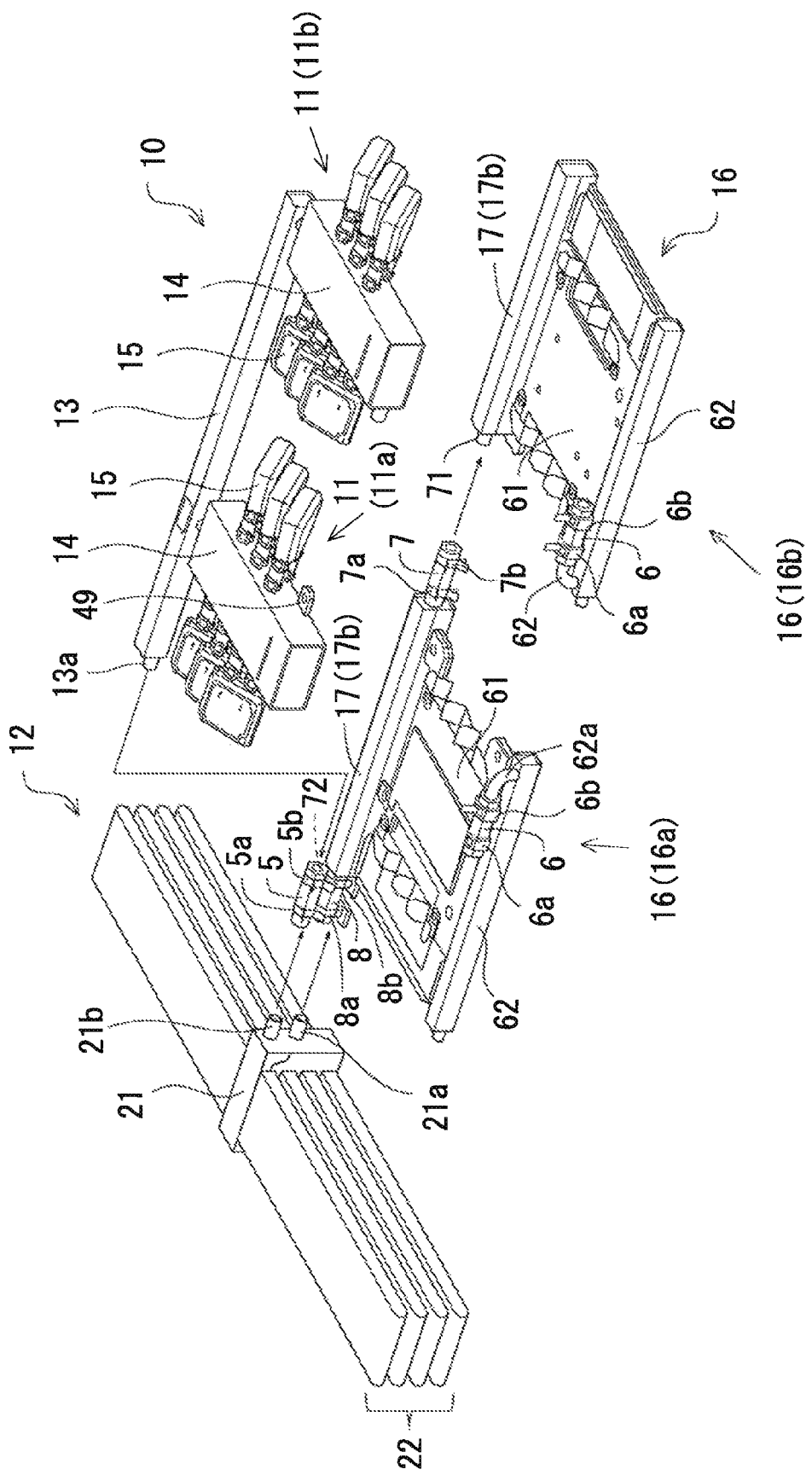
FIG. 3 is an exploded perspective view of a cooling unit according to embodiment 1.
Figure 4:
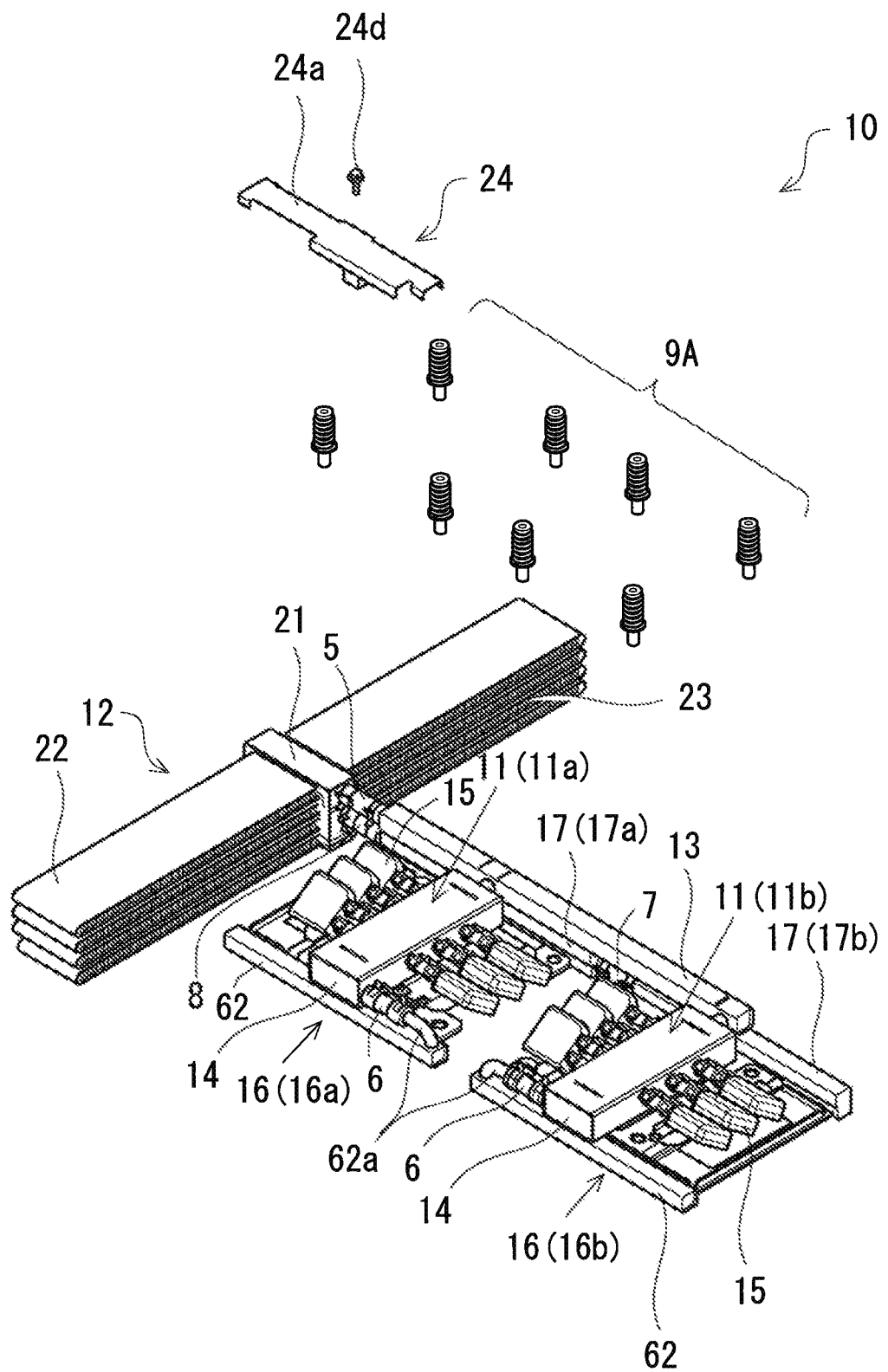
FIG. 4 is a perspective view of the cooling unit according to embodiment 1.
Figure 5:
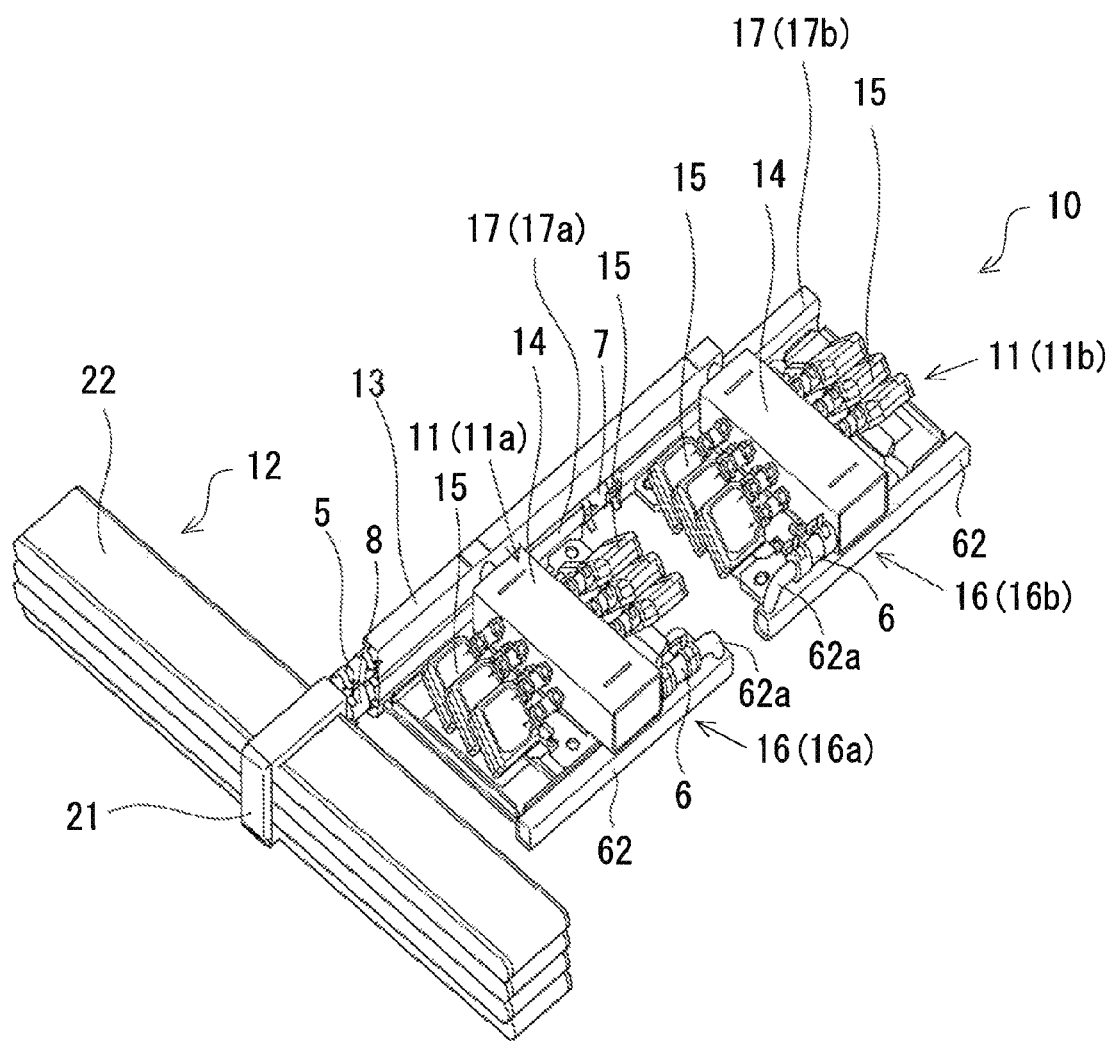
FIG. 5 is a perspective view of the cooling unit according to embodiment 1.
Figure 6:
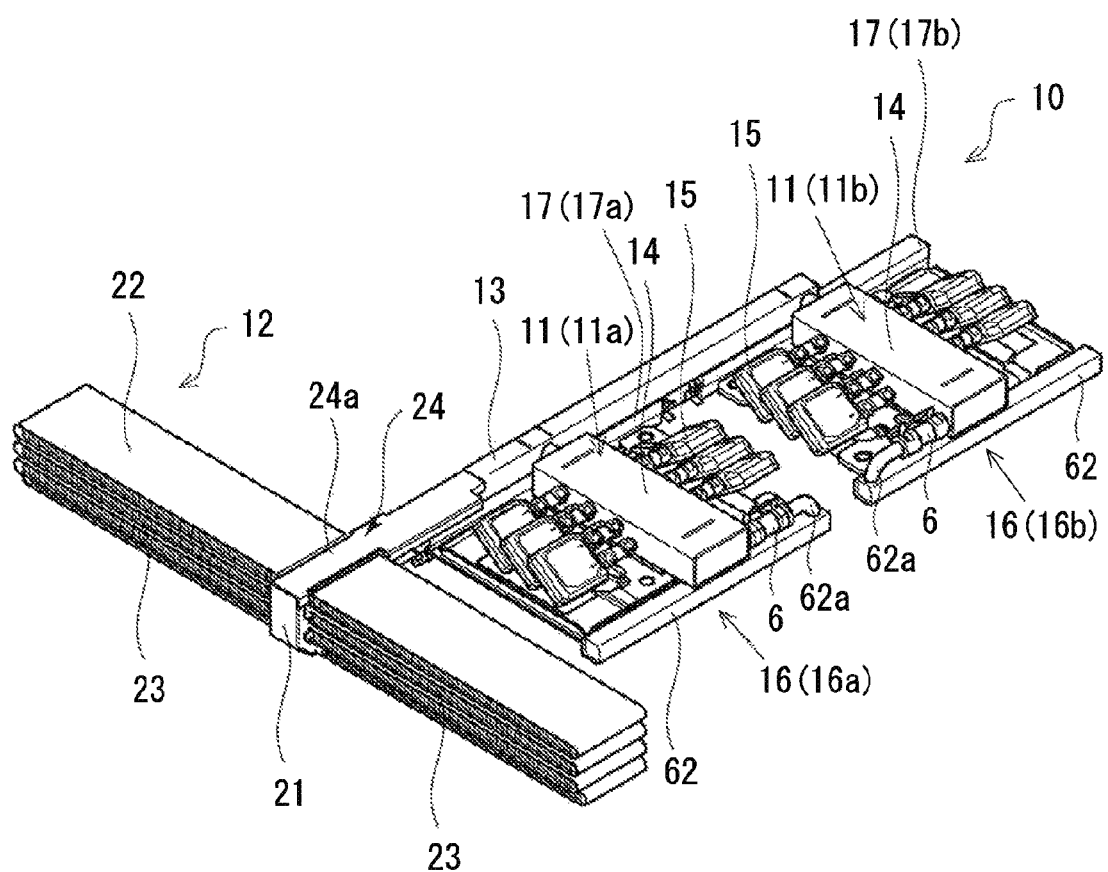
FIG. 6 is a perspective view of the cooling unit according to embodiment 1.
Figure 7:
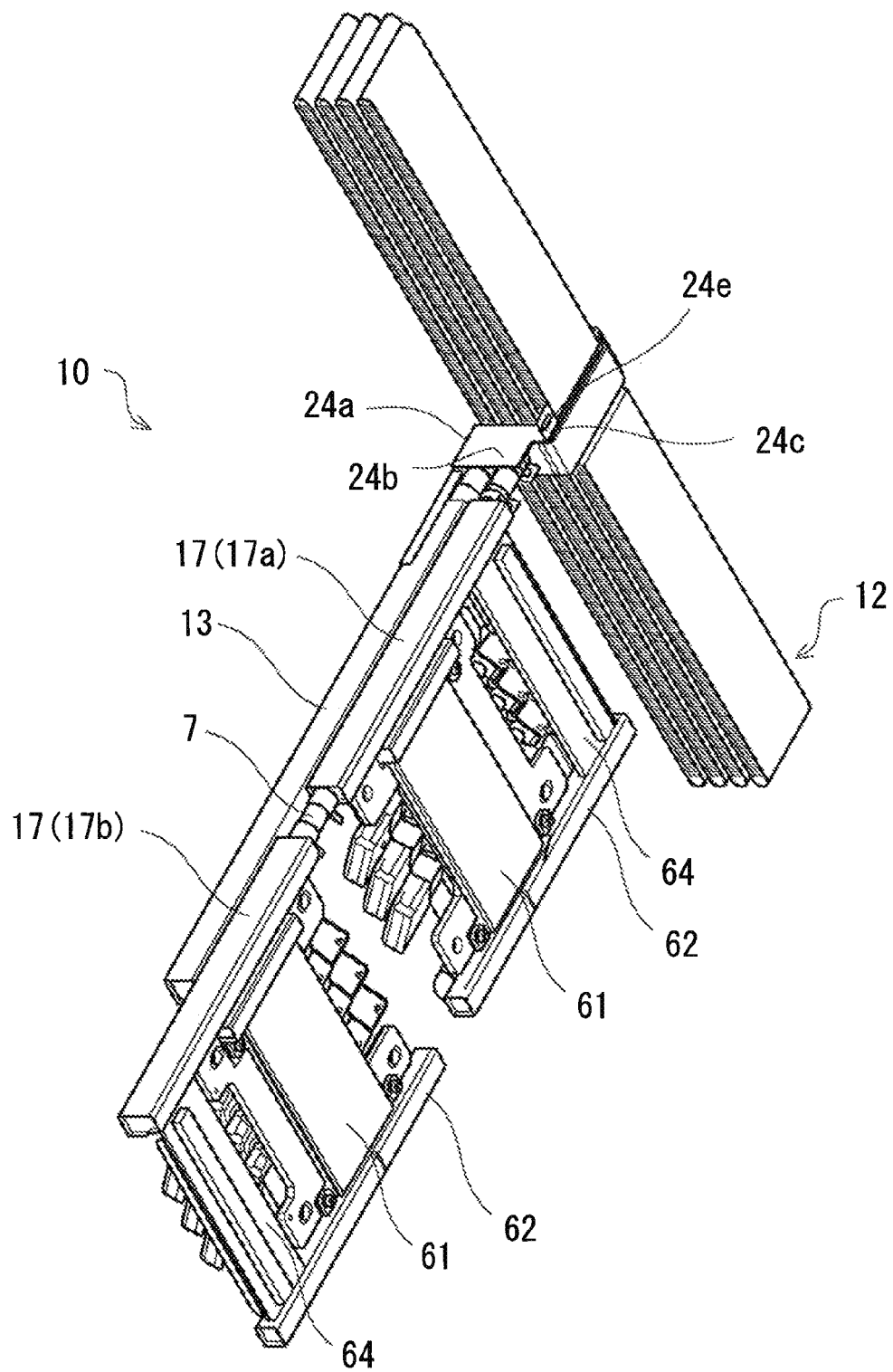
FIG. 7 is a perspective view of the cooling unit according to embodiment 1.
Figure 8:
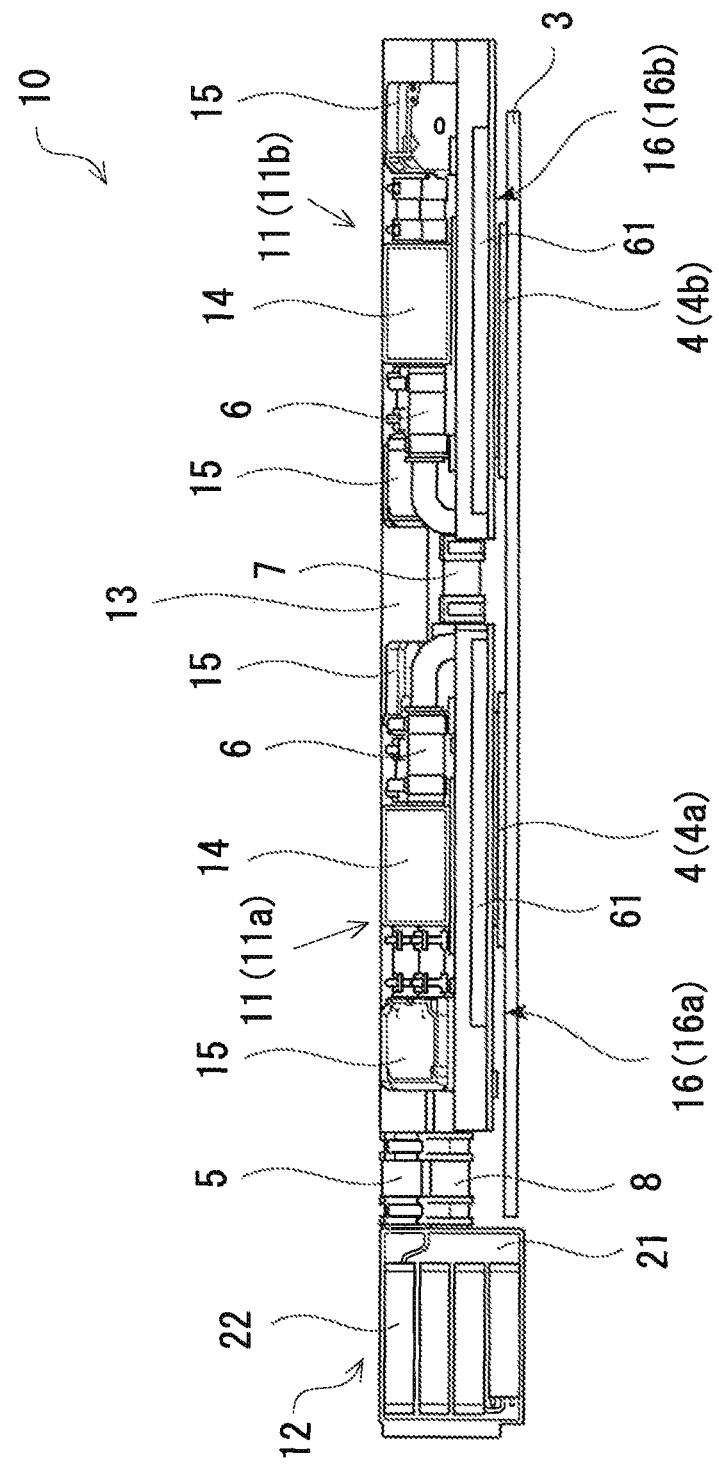
FIG. 8 is a side view of the cooling unit according to embodiment 1.

FIG. 3 is an exploded perspective view of the cooling unit 10 according to embodiment 1. FIGS. 4 to 7 are perspective views of the cooling unit 10 according to embodiment 1. FIGS. 4 to 6 illustrate states of the cooling unit 10 seen from above. Further, FIG. 7 illustrates a state of the cooling unit 10 seen from below. FIG. 8 is a side view of the cooling unit 10 according to the embodiment. FIG. 8 illustrates a state in which the cooling unit 10 is built into the casing 2, and also illustrates the CPUs 4 and the mother board 3. The cooling unit 10 includes a radiator module 12, a feeding pipe 13, tanks 14, pumps 15, heat receiving modules 16 as heat receiving units, a return pipe 17, a blower fan 18 and the like. Note that the blower fan 18 is illustrated in FIG. 1, and illustration thereof is omitted in FIGS. 2 to 8. The blower fan 18 is a device for forcefully blowing air to an inside of the casing 2.

In the cooling unit 10, the radiator module 12, the feeding pipe 13, the tank 14, the pumps 15, the heat receiving module 16 and the return pipe 17 are connected in a closed loop shape, and by them, a circulation passage for circulating a cooling liquid as a refrigerant that cools the CPU 4 is formed. The cooling unit 10 causes the cooling liquid to absorb heat that is generated by the CPU 4, and thereby cools the CPU 4. As the cooling liquid, for example, a nonfreezing solution of propylene glycol is used, but the cooling liquid is not limited to this, and may be water, for example.

The heat receiving module 16 is a module for taking the heat from each CPU 4 by the cooling liquid, and is provided to contact each CPU 4 thermally. In the example illustrated in FIG. 7, the heat receiving modules 16 are mounted (attached) onto top surfaces of the respective CPUs 4. Further, as illustrated in FIG. 2, the electronic equipment 1 (casing 2) in the present embodiment includes the two CPUs 4, and the two CPUs 4 are cooled by the cooling unit 10. However, on the electronic equipment 1 (casing 2), a plurality of CPUs 4 as the heat-generating components can be mounted, and the number of the CPUs 4 is not especially limited. Further, an object to be cooled by the cooling unit 10 is not limited to the CPU 4, and other heat-generating components may be cooled.

The pump 15 is, for example, an electric pump, and circulates the cooling liquid in the circulation passage in the cooling unit 10. Namely, the pump 15 is a power source which circulates the cooling liquid in the circulation passage. The heat receiving module 16 is a cooling jacket having an internal channel that allows the cooling liquid to pass through therein, and causes the heat of the CPUs 4 to be absorbed by the cooling liquid which flows through the internal channel. The details of the heat receiving module 16 will be described later.

The radiator module 12 is a radiator that radiates the heat of the cooling liquid which is recovered through the return pipe 17 into the atmosphere, and feeds out the cooling liquid which is cooled by the heat radiation to the feeding pipe 13. The radiator module 12 has a connecting portion 21, and a tube channel 22. The connecting portion 21 and the tube channel 22 are formed by a metal such as aluminum, for example. An inside of the connecting portion 21 is divided into two, a recovery chamber and a supply chamber, by a partition wall (not illustrated). A front surface of the connecting portion 21 is provided with an inflow nozzle 21a and a discharge nozzle 21b. Here, the inflow nozzle 21a is a nozzle that is connected to the recovery chamber of the connecting portion 21, and the return pipe 17 is connected to the inflow nozzle 21a. Meanwhile, the discharge nozzle 21b is a nozzle that is connected to the supply chamber of the connecting portion 21, and the feeding pipe 13 is connected to the discharge nozzle 21b.

The tube channel 22 of the radiator module 12 forms a loop shape by being folded back halfway, and has a heat radiating fin 23 inside a turning portion. The tube channel 22 has one end thereof connected to the supply chamber of the connecting portion 21, and has the other end connected to the supply chamber of the connecting portion 21. The radiator module 12 collects the cooling liquid which flows through the return pipe 17 into the recovery chamber of the connecting portion 21 from the inflow nozzle 21a. The cooling liquid in the recovery chamber of the connecting portion 21 is distributed to the respective tube channels 22. Subsequently, the cooling liquid passes through the tube channel 22 and the supply chamber of the connecting portion 21, and thereafter is fed out to the feeding pipe 13 from the discharge nozzle 21b.

The cooling liquid which is returned to the radiator module 12 from the return pipe 17 has a high temperature since the cooling liquid absorbs the heat of the respective CPUs 4. When the cooling liquid passes through the tube channel 22, the heat of the cooling liquid is radiated from the radiating fin 23 of the tube channel 22, and thereby the cooling liquid is air-cooled. The cooling liquid the temperature of which becomes low by passing through the tube channel 22 is fed out to the feeding pipe 13 from the discharge nozzle 21b. Further, an air outlet of the blower fan 18 is disposed to face the tube channel 22 of the radiator module 12. By blown air from the blower fan 18, heat radiation from the radiator module 12 (tube channel 22) is promoted. Note that the radiator module 12 in the present embodiment has the four tube channels 22, but the number of the tube channels 22 is not especially limited. Note that in the present embodiment, the radiator module 12 and the blower fan 18 are directly fixed to the casing 2. Note that the feeding pipe 13, the tank 14, the pump 15, the heat receiving module 16 and the return pipe 17 are mounted on the mother board 3, and any one or a plurality of members of them may be directly fixed to the casing 2.

Figure 9:
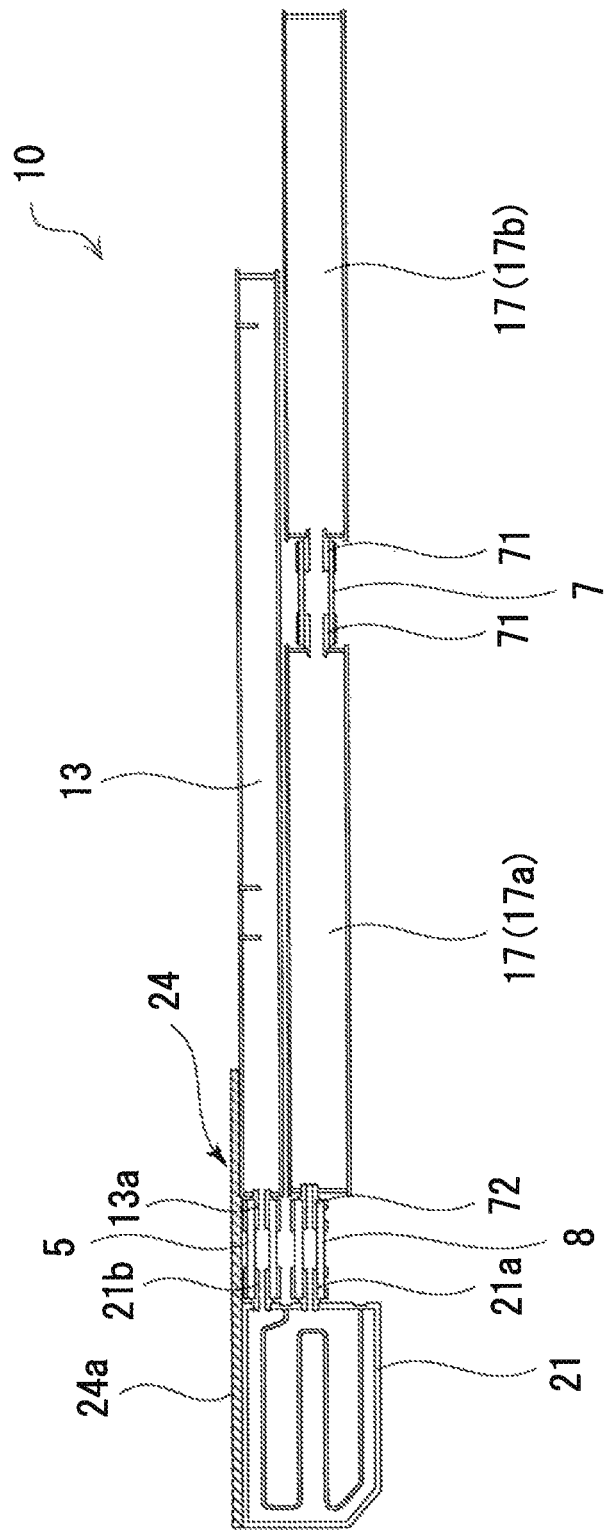
FIG. 9 is a view explaining an mounting mode of a radiator holding member according to embodiment 1.

The radiator module 12 is fixed to the casing 2 via a radiator holding member that is represented by reference numeral 24 in FIGS. 2, 4, 6 and the like, for example. FIG. 9 is a view explaining a mounting mode of the radiator holding member 24. The radiator holding member 24 has a top surface plate portion 24a, a side surface plate portion 24b, and a mounting portion 24c. The top surface plate portion 24a has a planar shape and a size capable of being attached (fixed) across a top surface of the connecting portion 21 in the radiator module 12 and a top surface of the feeding pipe 13. The top surface plate portion 24a of the radiator holding member 24 is bonded onto both the surfaces by, for example, a double-sided adhesive tape or the like to be across the top surface of the connecting portion 21 of the radiator module 12 and the top surface of the feeding pipe 13, namely, to be across flexible tubes 5 and 8 that will be described later.

The side surface plate portion 24b of the radiator holding member 24 hangs downward from the top surface plate portion 24a, and the mounting portion 24c is connected to a tip end portion thereof (refer to FIG. 7). Further, the mounting portion 24c is folded toward a side to be orthogonal to the side surface plate portion 24b to be parallel with the top surface plate portion 24a. As illustrated in FIG. 7, a mounting hole 24e of a size that allows a mounting screw 24d to be inserted through it is formed in the mounting portion 24c. The radiator holding member 24 is fixed to the casing 2 via the mounting screw 24d. More specifically, the mounting screw 24d may be inserted through a through-hole (not illustrated) formed in the casing 2 and the mounting hole 24e, and the radiator holding member 24 may be fastened to the casing 2 with use of a nut or the like not illustrated. In this manner, the radiator module 12 is directly fixed to the casing 2 by the radiator holding member 24. Note that FIG. 5 illustrates a state before the radiator holding member 24 is placed on the connecting portion 21 and the feeding pipe 13 in the radiator module 12.

The feeding pipe 13 is a prismatic hollow member, and has a channel for passing the cooling liquid formed in an inside thereof. The feeding pipe 13 is a stiff (rigid) pipe with rigidity, and is formed by, for example, a metal such as aluminum. Further, an inflow nozzle 13a is provided at one end surface in a longitudinal direction of the feeding pipe 13. The inflow nozzle 13a of the feeding pipe 13 and the discharge nozzle 21b of the radiator module 12 are connected to each other to be relatively displaceable from each other via a flexible tube 5 with flexibility. Further, an opening is formed in one side surface that is formed along the longitudinal direction of the feeding pipe 13, and the tank 14 is joined through the opening. Note that both end portions of the flexible tube 5 that are fitted onto the discharge nozzle 21b and the inflow nozzle 13a are fastened by tube bands 5a and 5b. Thereby, the flexible tube 5 is restrained from being disengaged from the discharge nozzle 21b and the inflow nozzle 13a. The tube bands 5a and 5b are made of a metal, but may be made of, for example, a resin, without being limited thereto.

In the present embodiment, the tank 14 and the pump 15 are integrated, and these are collectively called a pump module 11. The pump module 11 is a module in which the tank 14 and the pump 15 are integrated. Further, the tank 14 and the feeding pipe 13 are integrally joined rigidly by a joining method such as brazing (soldering), for example. When an operator carries the cooling unit 10, the operator grasps the feeding pipe 13 or the tank 14 which is rigidly joined thereto, whereby handling becomes easy. Namely, when the operator lifts up the cooling unit 10 by grasping the feeding pipe 13 or the tank 14, the posture, the shape, the form and the like as the entire cooling unit 10 can be kept, and therefore, the advantage of being easy to handle is provided. Further, a tab 49 (refer to FIG. 3) provided with a hole protrudes in the horizontal direction from a bottom surface of each of the tanks 14, and a male screw not illustrated is inserted through the hole. Meanwhile, a female screw not illustrated is formed in the cooling plate 61, and the female screw and the aforementioned male screw are screwed in each other, whereby the pump module 11 and the heat receiving module 16 are coupled. Thereby, even when the pump module is lifted up, the heat receiving module 16 (16a, 16b) do not hang down. Further, even in a state in which a tip end of the male screw reaches a bottom portion of the female screw of the cooling plate 61, a space is present between a head portion of the male screw and the tab 49, and therefore, the pump module 11 and the heat receiving module 16 are relatively displaceable.

Next, detailed structures of the heat receiving module 16, the tank 14 and the pump 15 will be described. In the cooling unit 10, the heat receiving module 16, the tank 14 and the return pipe 17 are provided at each CPU 4 to correspond to the CPU 4 as an object to be cooled. Here, when the CPUs 4 illustrated in FIG. 2 are distinguished from each other, one of them is called a first CPU 4a, whereas the other one is called a second CPU 4b. Hereinafter, the heat receiving module and the pump module corresponding to the first CPU 4a will be called a first heat receiving module 16a and a first pump module 11a, respectively. Further, the heat receiving module and the pump module corresponding to the second CPU 4b will be called a second heat receiving module 16b and a second pump module 11b, respectively.

Figure 10:
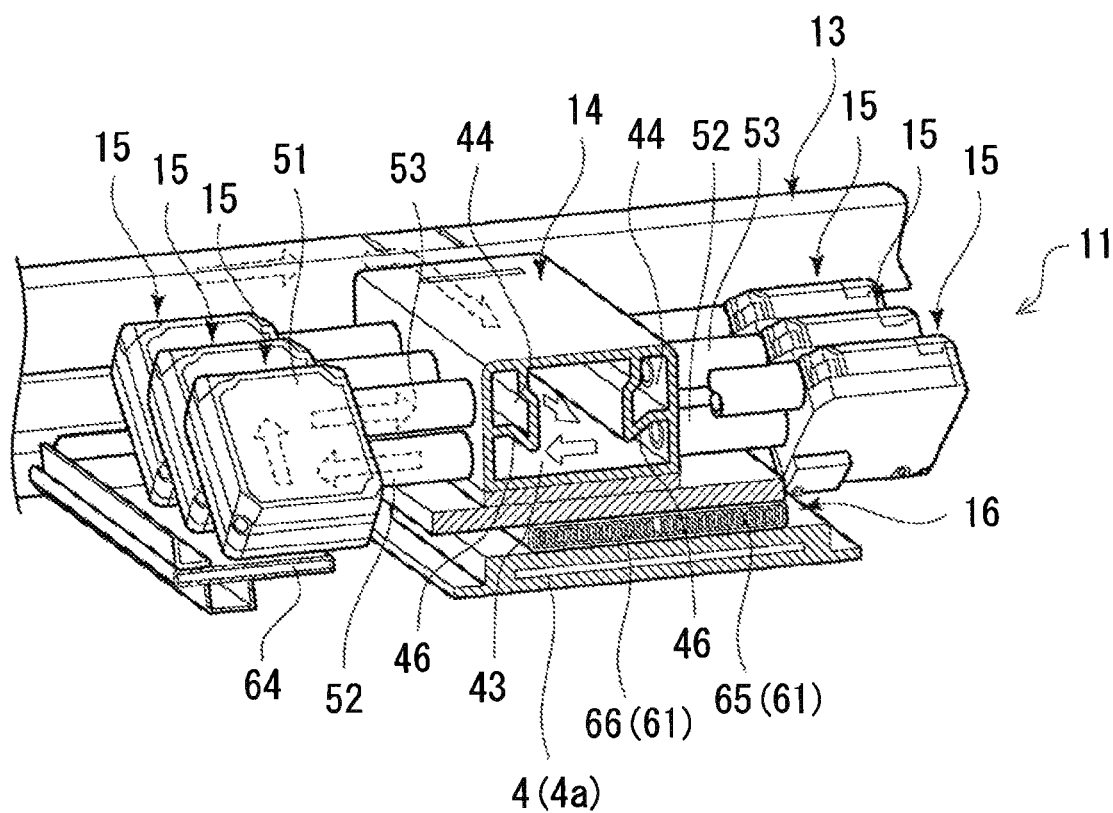
FIG. 10 is a view illustrating an internal structure of a tank and a pump according to embodiment 1.
Figure 11:
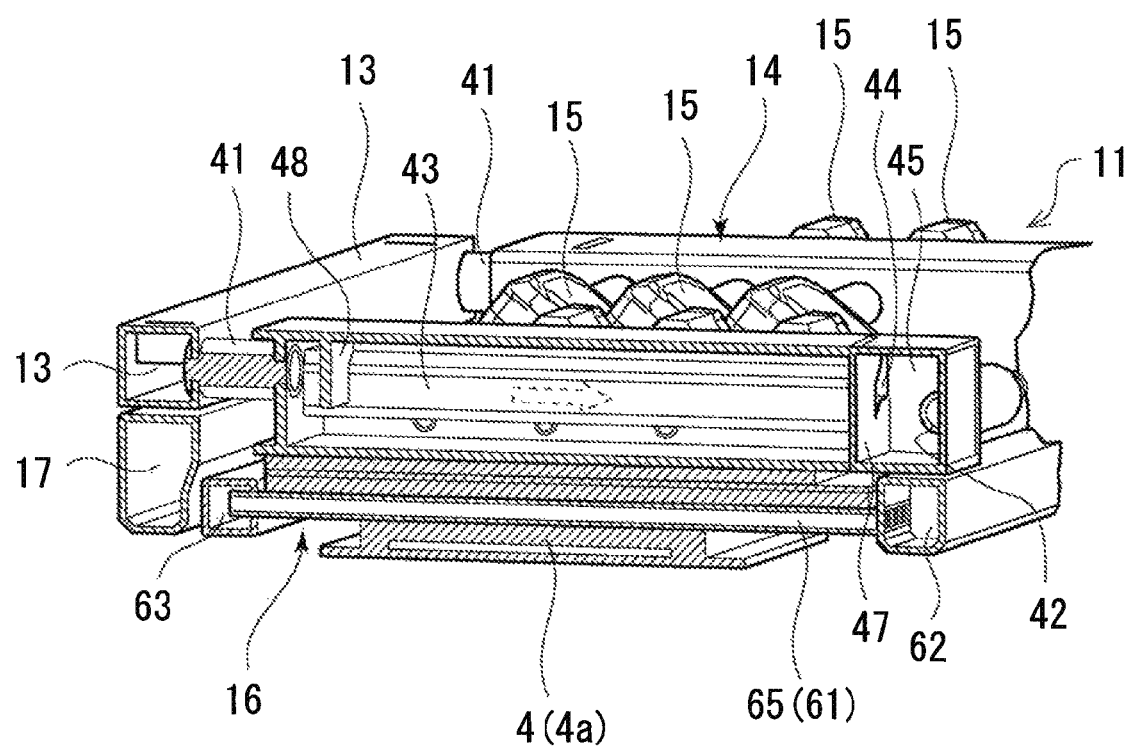
FIG. 11 is a view illustrating the internal structure of the tank and the pump according to embodiment 1.
Figure 12:
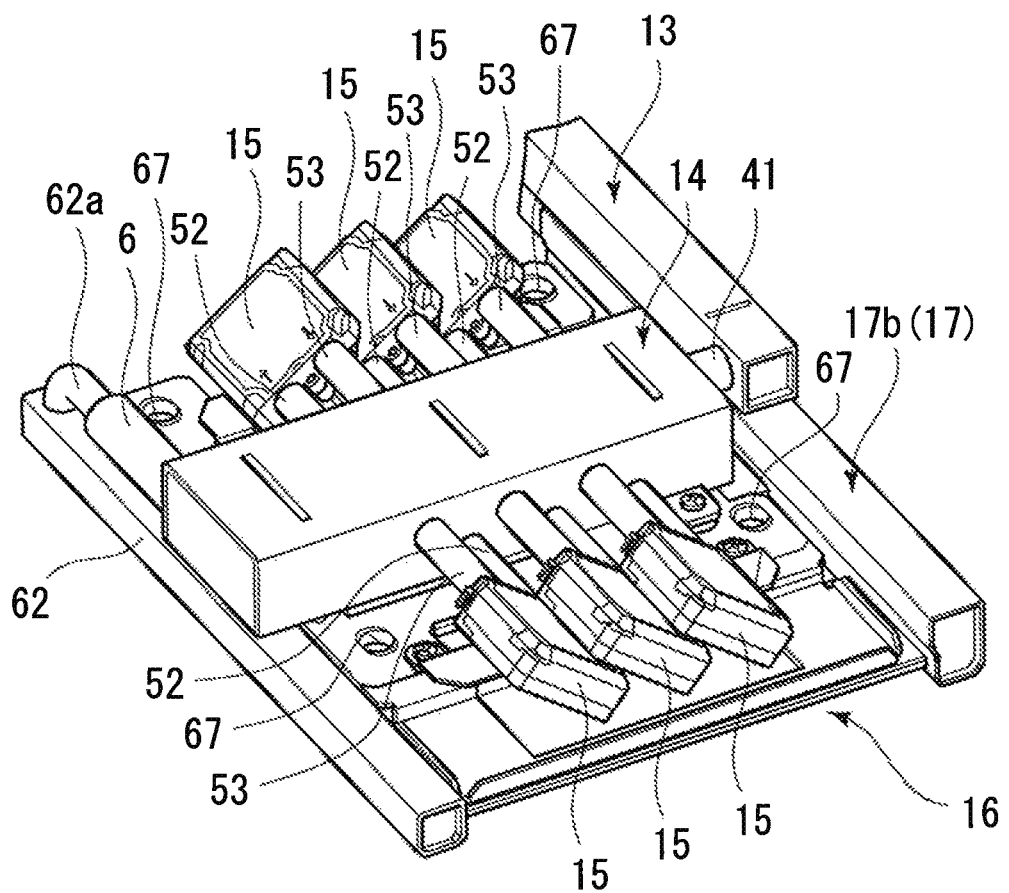
FIG. 12 is a perspective view illustrating a heat receiving module and peripheral members thereof according to embodiment 1.

The pump 15 and the heat receiving module 16 are connected to each of the tanks 14. FIG. 10 and FIG. 11 are views illustrating internal structures of the tank 14 and the pump 15 according to embodiment 1. FIG. 10 illustrates sectional structures of the tank 14 and the pump 15 along an extending direction of the feeding pipe 13. FIG. 11 illustrates sectional structures of the tank 14 and the pump 15 cut along a direction orthogonal to the extending direction of the feeding pipe 13. FIG. 12 is a perspective view illustrating the heat receiving module 16 and peripheral members thereof according to the embodiment. Note that FIGS. 10 and 11 illustrate the structures of the first heat receiving module 16a and the first pump module 11a corresponding to the first CPU 4a, whereas FIG. 12 illustrates the second heat receiving module 16b and the second pump module 11b corresponding to the second CPU 4b.

With reference to FIG. 10 and FIG. 11, the details of the tank 14 and the pump 15 in the pump module 11 will be described. The tank 14 has a connecting pipe 41. The tank 14 is a rigid pipe similarly to the feeding pipe 13, and is formed by, for example, a metal such as aluminum. The connecting pipe 41 of the tank 14 is joined to an opening formed in the side surface of the feeding pipe 13. The tank 14 introduces the cooling liquid from the feeding pipe 13 into the inside thereof via the connecting pipe 41.

As illustrated in FIGS. 10 and 11, the tank 14 has an outer shape of a substantially rectangular parallelepiped, and the aforementioned connecting pipe 41 is formed at one end side in a longitudinal direction thereof. The connecting pipe 41 is made of a metal, and is rigidly joined to the tank 14 and the feeding pipe 13 by brazing or the like. Meanwhile, in the tank 14, at a side surface around an end portion at an opposite side from the side where the connecting pipe 41 is provided, a discharge nozzle 42 for discharging the cooling liquid from the tank 14 is formed. Note that in the following description, a section of the tank 14 illustrated in FIG. 10 is defined as a longitudinal section in a short side direction, whereas a section of the tank 14 illustrated in FIG. 11 is defined as a longitudinal section in a long side direction.

The tank 14 temporarily stores (houses) the cooling liquid. A first to a third tank chambers 43, 44 and 45 are formed inside the tank 14, and the respective tank chambers are delimited by an outer wall of the tank 14 and partition walls 46 and 47. The partition wall 46 is a substantially L-shaped wall body that is formed along the long side direction of the tank 14, and provides a partition between the first tank chamber 43 and the second tank chamber 44. The second tank chambers 44 are formed in both corner portions at an upper side in the longitudinal section in the short side direction in the tank 14, except for an end portion side where the discharge nozzle 42 is provided, and in a remaining region, the first tank chamber 43 is formed. Further, the third tank chamber 45 is formed in an end portion region where the discharge nozzle 42 is provided in the long side direction of the tank 14. Namely, the third tank chamber 45 is connected to the discharge nozzle 42. The partition wall 47 is a wall body that is formed along the short side direction of the tank 14, and provides a partition between the first tank chamber 43 and the third tank chamber 45. As illustrated in FIG. 11, the second tank chamber 44 and the third tank chamber 45 have no partition therebetween, and are spatially connected.

Six pumps 15 are integrally mounted to each of the tanks 14 (for example, refer to FIG. 5). In more detail, the three pumps 15 are arranged along each side surface in the long side direction of each of the tanks 14. However, the number of the pumps 15 which are mounted in each of the tanks 14, and a mounting mode thereof are not especially limited, and can be properly changed. The pump 15 has a pump main body 51, a suction pipe 52, and a discharge pipe 53. An impeller not illustrated is interposed inside the pump main body 51, and the impeller rotates by being supplied with electric power. One end side of the suction pipe 52 is connected to the pump main body 51, and the other end side is connected to the first tank chamber 43 of the tank 14. The pump 15 takes the cooling liquid from the first tank chamber 43 of the tank 14 into the pump main body 51 via the suction pipe 52. Further, one end side of the discharge pipe 53 is connected to the pump main body 51, and the other end side is connected to the second tank chamber 44 of the tank 14. The pump 15 feeds out the cooling liquid of the pump main body 51 to the second tank chamber 44 of the tank 14 via the discharge pipe 53. Further, as illustrated in FIG. 10, the connecting pipe 41 of the tank 14 allows the first tank chamber 43 and the feeding pipe 13 to communicate with each other. The cooling liquid from the radiator module 12, which flows from the feeding pipe 13, flows into the first tank chamber 43 of the tank 14.

As illustrated in FIG. 11, a bubble removing plate 48 that is such a hanging wall that faces the connecting pipe 41 at a predetermined dimension away from the connecting pipe 41 is provided inside the first tank chamber 43. The bubble removing plate 48 divides a space in the first tank chamber 43 with a lower side of the first tank chamber 43 left. The cooling liquid which flows to the inside of the first tank chamber 43 from the feeding pipe 13 reaches the suction pipe 52 of each of the pumps 15 in such a manner as to get under the bubble removing plate 48. When bubbles are included in the cooling liquid which is supplied from the feeding pipe 13, the bubbles gather at an upper portion in the first tank chamber 43. Accordingly, by providing the bubble removing plate 48, the bubbles in the cooling liquid can be removed. Note that as a position where the bubble removing plate 48 is disposed in a longitudinal direction of the first tank chamber 43, a position which is nearer to the connecting pipe 41 than the suction pipe 52 of the pump 15, which is disposed at the position that is the nearest to the connecting pipe 41, is preferable. Thereby, the cooling liquid including bubbles can be restrained from being absorbed into all the pumps 15. As a result, idling of the impeller due to inflow of bubbles to the pump main body 51 can be suppressed, and therefore, the advantage that a failure of the pump 15 hardly occurs is provided.

When the pump 15 is driven, the impeller in the pump main body 51 rotates, and the cooling liquid after the bubbles are removed in the first tank chamber 43 is sucked by the pump 15 through the suction pipe 52, and is discharged to the second tank chamber 44 via the discharge pipe 53. The cooling liquid which is discharged to the second tank chamber 44 moves toward the third tank chamber 45 side along the long side direction of the tank 14, and flows to an outside of the tank 14 from the discharge nozzle 42 which is formed in the third tank chamber 45. The cooling liquid from the tank 14 is supplied to the heat receiving module 16 as will be described later. The discharge nozzle 42 is one example of an open nozzle.

Note that the suction pipe 52 and the discharge pipe 53 in the pump 15 may be pliant flexible tubes. For example, nozzles that are respectively provided at the tank 14 side and the pump 15 side are connected by a flexible tube and both ends thereof can be fastened by tube bands. In this case, the pump 15 which has the performance corresponding to the need can be fitted to the tank 14. Further, since the pump 15 is electronic equipment, the pump 15 which is produced separately from the tank 14 is assembled to the tank 14, and thereby the advantage of being able to enhance manufacture efficiency can be expected.

Figure 13:
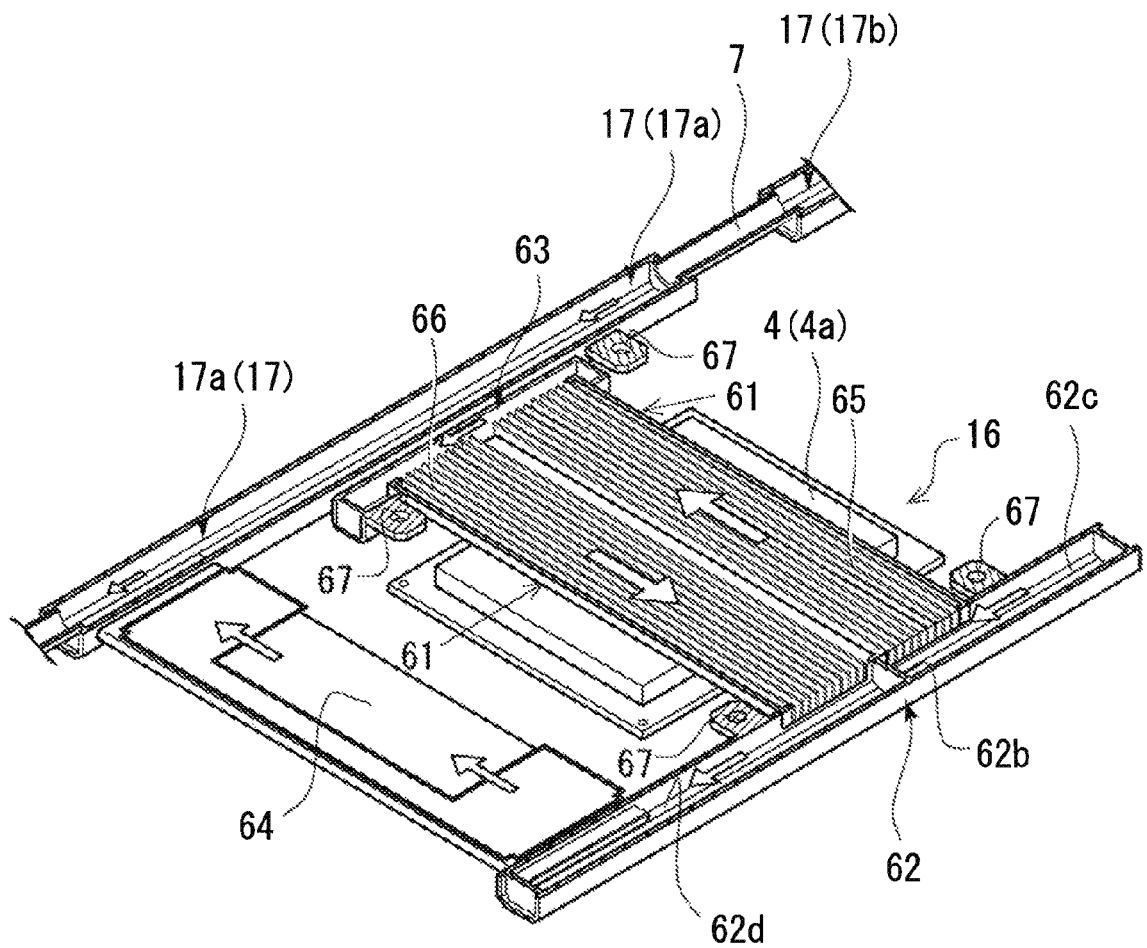
FIG. 13 is a view illustrating an internal structure of the heat receiving module according to embodiment 1.
Figure 14:
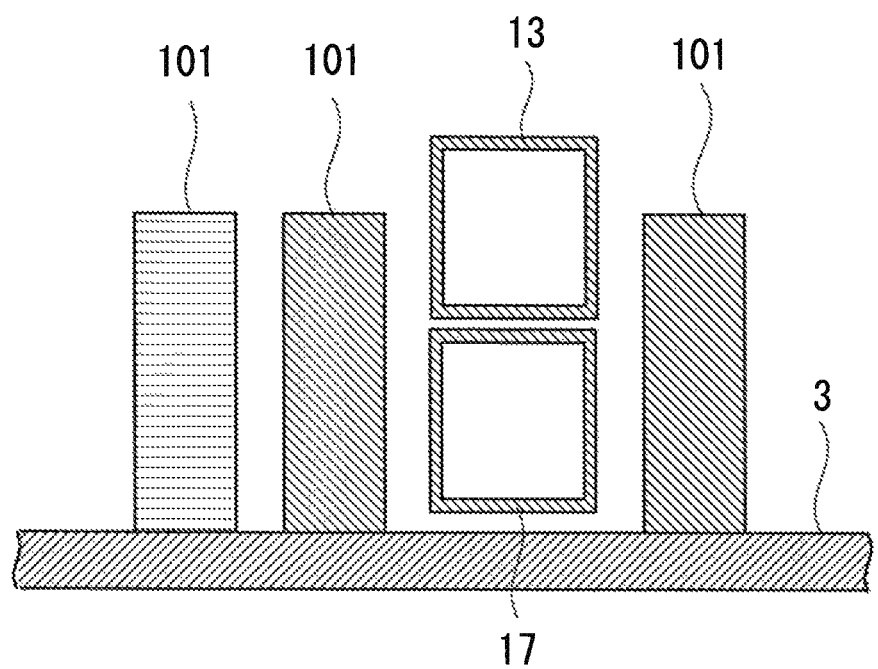
FIG. 14 is a view schematically illustrating a situation in which a feeding pipe and a return pipe are arranged vertically in two stages according to embodiment 1.

Next, the details of the heat receiving module 16 will be described. FIG. 13 is a view illustrating an internal structure of the heat receiving module 16 according to embodiment 1. More specifically, the heat receiving module 16 illustrated in FIG. 13 illustrates a horizontal section of the first heat receiving module 16a. The heat receiving module 16 has a cooling plate 61, a first passage portion 62, a second passage portion 63, a discharge pipe 64 and the like. Insides of the first passage portion 62 and the second passage portion 63 are hollow prismatic members, but are not limited to this shape. The cooling plate 61 is connected to respective side surfaces of the first passage portion 62 and the second passage portion 63. The first passage portion 62 and the second passage portion 63 are disposed to be substantially parallel with each other in such a manner as to sandwich the cooling plate 61. Further, an inflow nozzle 62a is formed at one end of the first passage portion 62 (refer to FIGS. 3, 4 and the like). Note that in FIG. 3, illustration of a spacer member of the cooling plate 61 in the second heat receiving module 16b is omitted. Further, the discharge pipe 64 is connected to one end of the first passage portion 62. Though the details will be described later, the inflow nozzle 62a is connected to the discharge nozzle 42 of the tank 14 via a flexible tube.

The cooling plate 61, the first passage portion 62, the second passage portion 63 and the discharge pipe 64 are formed by, for example, a metal such as aluminum. The cooling plate 61 is attached (mounted) on an upper portion of the CPU 4 so as to contact the CPU 4 thermally. However, the cooling plate 61 can be fitted in a state thermally contacting the CPU 4, and a specific fitting mode to the CPU 4 is not especially limited. Inside the cooling plate 61, an internal channel for passing the cooling liquid therethrough is formed. In an example illustrated in FIG. 13, in the cooling plate 61, a first internal channel 65 and a second internal channel 66 are disposed side by side. The first internal channel 65 and the second internal channel 66 are divided into a number of slim (narrow) passages by partition walls extending along a direction connecting the first passage portion 62 and the second passage portion 63 (refer to FIG. 10).

Here, reference numeral 67 in the drawing represents a screw insertion hole. The screw insertion hole 67 is a hole for inserting a spring holding nut 9A and a mounting screw portion 9B (refer to FIGS. 1, 2 and the like) for fixing the heat receiving module 16 (cooling plate 61) to the CPU 4, therethrough. The screw insertion holes 67 are formed at two spots of the first passage portion 62 in the heat receiving module 16, and at one spot of each of the second passage portion 63 and the return pipe 17. For example, the mounting screw portion 9B is a shaft member with a male screw thread cut thereon. Further, the four mounting screw portions 9B disposed at four corners of the CPU 4 are provided in a protruding manner on one plate member disposed at a back side of the mother board 3. The mounting screw portions 9B which are provided in the protruding manner on the plate member like this protrude to above the mother board 3 through through-holes provided at the mother board 3.

Meanwhile, the spring holding nut 9A is a spring-loaded screw for fixing the heat receiving module 16 to the CPU 4, and a female screw thread that can be screwed onto the mounting screw portion 9B is cut thereon. The heat receiving module 16 (cooling plate 61) is placed on a top surface of the CPU 4 with the mounting screw portion 9B inserted through the screw insertion hole 67, and a pair of the spring holding nut 9A and the mounting screw portion 9B are fastened. Thereby, by a restoring force of the spring of the compressed spring holding nut 9A, the cooling plate 61 can be pressed and fixed to the CPU 4. In the present embodiment, the spring holding nuts 9A are disposed at the four corners of the CPU 4, and therefore, the cooling plate 61 can be pressed against the CPU 4 with a good balance while the cooling plate 61 is kept in a parallel posture to the CPU 4. Thereby, close contactability of the cooling plate 61 to the CPU 4 is enhanced. As a result, an air layer with a large heat resistance is restrained from being formed between the cooling plate 61 and the CPU 4. Thereby, heat exchange between the cooling liquid which flows through the first internal channel 65 and the second internal channel 66 which are formed in the cooling plate 61 and the CPU 4 can be efficiently performed. Note that the mounting screw portion 9B may be directly fixed to a metal sheet of the casing 2.

Incidentally, as illustrated in FIG. 13, a partition plate 62b is provided in a position corresponding to a boundary of the first internal channel 65 and the second internal channel 66, in the longitudinal direction of the first passage portion 62, and thereby, the first passage portion 62 is divided into a supply chamber 62c and a recovery chamber 62d. The supply chamber 62c is a section for supplying the cooling liquid to the cooling plate 61, of the first passage portion 62. Meanwhile, the recovery chamber 62d is a section for recovering the cooling liquid from the cooling plate 61, of the first passage portion 62.

The inflow nozzle 62a of the first passage portion 62 communicates with the supply chamber 62c. The inflow nozzle 62a of the heat receiving module 16 (first passage portion 62) and the discharge nozzle 42 of the tank 14 are connected to each other to be relatively displaceable via a flexible tube 6 with flexibility. Note that both end portions of the flexible tube 6 fitted into the inflow nozzle 62a and the discharge nozzle 42 are fastened by tube bands 6a and 6b. Thereby, the flexible tube 6 is restrained from being detached from the inflow nozzle 62a and the discharge nozzle 42. The tube bands 6a and 6b are made of a metal, but are not limited to this, and may be made of, for example, a resin.

The first internal channel 65 in the cooling plate 61 has one end connected to the supply chamber 62c and the other end connected to the second passage portion 63. Further, the second internal channel 66 in the cooling plate 61 has one end connected to the second passage portion 63, and the other end connected to the recovery chamber 62d. The cooling liquid from the tank 14 flows into the supply chamber 62c from the inflow nozzle 62a, and the cooling liquid which flows into the supply chamber 62c flows in the first internal channel 65 toward the second passage portion 63. Subsequently, the cooling liquid which passes through the second passage portion 63 flows in the second internal channel 66 from the second passage portion 63 toward the recovery chamber 62d. In this manner, the second passage portion 63 functions as a pipe for connecting a going and a returning paths for the cooling liquid by the first internal channel 65 and the second internal channel 66 in the cooling plate 61. The cooling liquid which is supplied to the heat receiving module 16 from the tank module 11 absorbs the heat of the CPU 4 which is in a thermal contact state with the cooling plate 61, when the cooling liquid flows in the first internal channel 65 and the second internal channel 66. In this manner, the cooling liquid which is supplied to the cooling plate 61 takes away the heat of the CPU 4, and thereby the CPU 4 is cooled.

Meanwhile, the cooling liquid the temperature of which rises due to absorption of the heat from the CPU 4 flows in the recovery chamber 62d toward the discharge pipe 64. In the example illustrated in FIG. 13, the discharge pipe 64 has a flat shape, but may adopt other shapes. The discharge pipe 64 has one end joined to the recovery chamber 62d, and the other end joined to the return pipe 17. Joining of the discharge pipe 64 to the first passage section 62 and the return pipe 17 is performed by, for example, brazing or the like. Note that in the cooling unit 10 in the present embodiment, the return pipe 17 is disposed adjacently to the second passage portion 63 so as to be along the second passage portion 63 of the heat receiving module 16. Further, a space provided at a lower portion of the discharge pipe 64 can be used as a loading space for electronic components to be mounted on the mother board 3. In this case, the discharge pipe 64 and the electronic components which are disposed under the discharge pipe 64 may be disposed in thermal contact with each other. Thereby the advantage of being able to cool the electronic components by the cooling liquid which flows in the discharge pipe 64 is provided.

The cooling liquid which is warmed by the absorbed heat from the CPU 4 when passing through the cooling plate 61 of the heat receiving module 16 is discharged to the return pipe 17 from the discharge pipe 64. The return pipe 17 in the cooling unit 10 is provided to correspond to each heat receiving module 16. Namely, the cooling unit 10 includes the return pipes 17 the number of which corresponds to the number of the heat receiving modules 16. Note that since the heat receiving modules 16 are provided to correspond to the respective CPUs 4, the number of the return pipes 17 is equal to the number of the CPUs 4 which are the objects to be cooled.

Here, when the return pipe 17 which is connected to the first heat receiving module 16a and the return pipe 17 which is connected to the second heat receiving module 16b are illustrated by being distinguished from each other, the former is represented by reference numeral and symbol 17a, whereas the latter is represented by 17b. The return pipe 17a and the return pipe 17b are connected in series. More specifically, the return pipe 17a and the return pipe 17b are connected via a flexible tube 7 with flexibility. Namely, connecting nozzles 71 which are formed respectively at one end of the return pipe 17a and one end of the return pipe 17b are connected to each other to be relatively displaceable via the flexible tube 7. The connecting nozzle 71 is a nozzle for connecting each of the return pipes 17. Note that when the flowing direction of the cooling liquid is set as a reference with respect to the return pipe 17a and the return pipe 17b, the return pipe 17a is at a downstream side relatively. Note that both end portions of the flexible tube 7 which are fitted in each of a pair of connecting nozzles 71 are fastened by tube bands 7a and 7b. Thereby, the flexible tube 7 is restrained from being detached from the pair of the connecting nozzles 71. The tube bands 7a and 7b are made of a metal, but are not limited thereto, and may be made of, for example, a resin.

In the cooling unit 10, the return pipe 17 which is located the most downstream among a plurality of return pipes 17 is connected to the connecting portion 21 of the radiator module 12. In this case, the return pipe 17a which is relatively located at a downstream side is connected to the connecting portion 21 of the radiator module 12. In the return pipe 17a, a discharge nozzle 72 is formed at an end portion where the connecting nozzle 71 is not formed (refer to FIG. 9). The discharge nozzle 72 of the return pipe 17a is connected to the inflow nozzle 21a of the radiator module 12 to be relatively displaceable via a flexible tube 8 with flexibility. Note that both end portions of the flexible tube 8 which are fitted into the inflow nozzle 21a and the discharge nozzle 72 are fastened by tube bands 8a and 8b. Thereby, the flexible tube 8 is restrained from being detached from the inflow nozzle 21a and the discharge nozzle 72. The tube bands 8a and 8b are made of a metal, but are not limited thereto, and may be made of, for example, a resin.

In the cooling unit 10 of the present embodiment, the flexible tubes 5 to 8 are rubber tubes having elastic deformability, but other materials may be used as long as they are connecting pipes having flexibility. For example, a bellows or the like that is a metallic material worked into an accordion shape and given flexibility may be adopted. In the present embodiment, both the ends of the flexible tubes 5 to 8 are fastened by the tube bands, and therefore, the flexible tubes 5 to 8 can be restrained from being detached from the nozzle unintentionally for some reason. Thereby, the cooling liquid which circulates in the circulation passage in the cooling unit 10 can be restrained from leaking outside.

In the cooling unit 10 according to the present embodiment, in order to secure handling easiness at the time of carrying the cooling unit 10, the feeding pipe 13, the tank 14 and the pump 15 are formed from rigid materials such as a metal, for example, and these members are rigidly joined by brazing or the like. Thereby, for example, when an operator grasps and lifts up the feeding pipe 13, the posture, the shape, the form and the like as the entire cooling unit 10 can be restrained from becoming unretainable, and handling becomes easy.

In particular, the radiator holding member 24 of the cooling unit 10 has the function as a radiator holding mechanism that fixes the radiator module 12 to the casing 2, and simultaneously connects the connecting portion 21 of the radiator module 12 and the feeding pipe 13. As described above, the top surface plate portion 24a of the radiator holding member 24 is across both the top surface of the connecting portion 21 and the top surface of the feeding pipe 13 and is bonded onto both the surfaces. According to this, the radiator module 12 can be restrained from hanging downward when the operator grasps the feeding pipe 13 and handles the cooling unit 10. Thereby, handling easiness of the cooling unit 10 is enhanced.

Meanwhile, a plurality of CPUs 4 are loaded (mounted) on the inside of the casing 2 of the electronic equipment 1, and each of the CPUs 4 is fixed to the mother board 3 by solder balls, sockets or the like, and therefore, the top surface heights of the respective CPUs 4 sometimes vary from one another. Further, a variation to some extent exists in dimensional precision of each individual body in the respective components of the cooling unit 10, the CPUs 4 and the mother board 3. Further, when the electronic equipment 1 is assembled, variations occur to respective positional relationships of the cooling unit 10, the CPUs 4 and the mother board 3 in some cases.

In response to the above, in the cooling unit 10 according to the present embodiment, connection is made by interposing the flexible tube 6 in the connecting portions of the heat receiving module 16 which is fitted to each of the CPUs 4 and the tank 14. According to this, the heat receiving module 16 can be relatively displaced with respect to the feeding pipe 13 and the tank 14 which are rigidly joined, by the elastic deformability that the flexible tube 6 has. Accordingly, even if variations of the top surface heights in the respective CPUs 4 occur, or some dimensional errors occur at the time of manufacture of the water-cooling unit 10 or at the time of assembly to the casing 2, these variations can be absorbed by flexibility, namely, the elastic deformability of the flexible tube 6. As a result, excessive stress can be restrained from being applied to the feeding pipe 13 and the tank 14.

Further, according to the cooling unit 10, the return pipe 17 to which the cooling liquid is discharged from the heat receiving module 16 is prepared for each heat receiving module 16, and the return pipes 17 are connected in series via the flexible tube 7, whereby the respective return pipes 17 are connected to each other to be relatively displaceable. By the flexibility, that is, the elastic deformability of the flexible tube 7, the return pipes 17 respectively corresponding to the heat receiving modules 16 can be freely displaced relatively. Therefore, variations of the top surface heights in the respective CPUs 4, a dimensional error that occurs at the time of manufacture of the water-cooling unit 10 or at the time of assembly to the casing 2, and the like are absorbed, and excessive stress can be restrained from being applied onto the respective return pipes 17.

Further, when the height variations of the respective CPUs 4 occur, or variations occur to the dimensions or disposing positions in the cooling unit 10, the CPUs 4, the mother board 3 and the like, the posture of the cooling unit 10 sometimes inclines with respect to the casing 2. In this case, if the feeding pipe 13 and the return pipe 17 are rigidly joined to the radiator module 12 respectively, a disposition surface of the heat radiating fin 23 becomes difficult to face correctly to a traveling direction of the blown air by the blower fan 18. In that case, a projected area in which the heat radiating fin 23 receives the blown air from the blower fan 18 decreases, and the cooling efficiency of the CPU 4 is likely to be reduced. Further, the other components and structures in the casing 2 and the radiator module 12 are likely to interfere with one another.

In contrast with this, in the cooling unit 10, the feeding pipe 13 and the return pipe 17 are connected to the radiator module 12 to be relatively displaceable to one another by the flexible tubes 5 and 8. Therefore, even if the heat receiving module 16 and the pump module 11 are inclined with respect to the casing 2, the posture of the radiator module 12 can be adjusted without large stress being applied to the feeding pipe 13, the return pipe 17 and the radiator module 12. Therefore, the cooling efficiency of the CPU 4 can be restrained from being reduced due to interference of the radiator module 12 with the other components and structures in the casing 2, and decrease of the blown air amount that the heat radiating fin 23 receives from the blower fan 18. Note that though the top surface of the connecting portion 21 in the radiator module 12 and the top surface of the feeding pipe 13 are connected via the radiator holding member 24, relative displacement in the lateral direction between the radiator module 12 and the feeding pipe 13 is not arrested. Accordingly, the disadvantage that adjustment of the posture of the radiator module 12 is limited by the radiator holding member 24 or the like does not occur.

Further, the radiator holding member 24 has the top surface plate portion 24a and the side surface plate portion 24b which are formed to surround the flexible tubes 5 and 8 which connect the respective feeding pipe 13 and return pipe 17 and the radiator module 12. Accordingly, at the time of manufacture of the electronic equipment 1, and at the time of maintenance operation, a tool or the like can be restrained from unintentionally contacting and breaking the flexible tubes 5 and 8.

Form the above, according to the cooling unit 10 according to the present embodiment, easiness of handling and breakage resistance can be made compatible. In addition, the cooling liquid which circulates in the cooling unit 10 can be also prevented from leaking outside, and therefore, causing a failure of the electronic equipment 1, and exerting an adverse effect on the reliability of the quality can be avoided.

In the present embodiment, each of the flexible tubes 5 to 8 is one example of the connecting pipe having flexibility. Further, in the cooling unit 10, until the cooling liquid is supplied to each of the heat receiving modules 16 from the radiator module 12, the cooling liquid passes sequentially through the feeding pipe 13, the internal channel of the tank 14, and the internal channel of the pump 15 to reach each of the heat receiving modules. The first to the third tank chambers 43, 44, 45 and the like correspond to the internal channels of the tank 14. Further, the suction pipe 52, the internal space of the pump main body 51, the discharge pipe 53 and the like correspond to the internal channels of the pump 15. The feeding pipe 13, the internal channels of the tank 14, and the internal channels of the pump 15 are examples of a supply pipe.

Incidentally, as illustrated in FIG. 1, in a periphery of the cooling unit 10 in the casing 2 of the electronic equipment 1, a slot 100 for equipping, for example, a memory such as DIMM is provided. Accordingly, when the operator of the electronic equipment 1 performs addition of memory and the other maintenance operations to the slot 100, the operator has an access to the inside of the casing 2. Meanwhile, in the discharge pipe 64 and the return pipe 17 of each of the heat receiving modules 16, the cooling liquid which has a high temperature by absorbing the heat from the CPU 4 flows. Therefore, when the operator performs a maintenance operation of the electronic equipment 1 as described above, the surfaces of the discharge pipe 64 and the return pipe 17 in each of the heat receiving modules 16 are sometimes in a high-temperature state.

In contrast with this, in the cooling unit 10 according to the present embodiment, the feeding pipe 13 and the return pipe 17 are disposed to have a vertical two-stage structure, as illustrated in FIGS. 5, 9 and the like. More specifically, the return pipe 17 is disposed at a lower stage, and the feeding pipe 13 is disposed at the upper portion of the return pipe 17 so that the feeding pipe 13 is laid on the return pipe 17 vertically. Further, the pump module 11 including the tank 14 and the pump 15 is disposed to cover the upper portion of the heat receiving module 16. The cooling liquid which flows in the feeding pipe 13 and the pump module 11 is in a state after being air-cooled by the radiator module 12 and before absorbing the heat from the CPU 4, and the temperature thereof is low. Therefore, the surfaces of the feeding pipe 13, the tank 14 and the pump 15 have a lower temperature as compared with the discharge pipe 64 and the return pipe 17 of the heat receiving module 16.

As above, the heat receiving module 16 and the return pipe 17 in which the high-temperature cooling liquid flows are placed on the lower stage, and the feeding pipe 13 and the pump module 11 in which the low-temperature cooling liquid flows are disposed on the upper stage to cover the upper portions thereof, whereby it becomes difficult for the operator to touch the member surfaces at a high temperature. Therefore, the operator can be restrained from suffering a burn at the time of a maintenance operation or the like of the electronic equipment 1.

Further, the feeding pipe 13 and the return pipe 17 are arranged vertically in the two stages, whereby the mounting space of the mother board 3 can be effectively used. Namely, in this case, as compared with the case in which the feeding pipe 13 and the return pipe 17 are arranged in a board plane direction, the mounting space for the other mounting components to be mounted on the mother board 3 is more easily secured. In particular, when many electronic components 101 that are taller than the return pipe 17 which is disposed on the lower stage of the feeding pipe 13 are mounted on the mother board 3, the electronic components 101 can be disposed adjacently to the feeding pipe 13 and the return pipe 17 which are vertically stacked. Thereby, the mounting space of the mother board 3 can be used effectively and usefully.

Further, in the cooling unit 10 according to the present embodiment, the feeding pipe 13 and the return pipe 17 have rectangular sections (refer to FIGS. 5 to 7, 11 and the like). According to this, the effect of easily securing a larger channel sectional area for the cooling liquid is obtained as compared with the case in which the feeding pipe 13, the return pipe 17 and the like are formed to be circular in section.

Further, as illustrated in FIG. 11, in the return pipe 17 in the cooling unit 10, a breadth in the lower region is narrower as compared with a breadth in the upper region in a height direction. The breadth in this case indicates a dimension in a width direction within a section orthogonal to the longitudinal direction of the return pipe 17. Thereby, the return pipe 17 hardly interferes with the other members (components) in the cooling unit 10, and the other mounting components which are mounted on the mother board 3. In the example illustrated in FIG. 11, the example of disposing the return pipe 17 relating to the cooling unit 10 and the second passage portion 63 of the heat receiving module 16 closely to each other is illustrated. In this example, in a range from the lower end in the return pipe 17 to a height corresponding to an upper end of the second passage portion 63, the breadth is reduced as compared with the region at the upper side from the range. According to this, while the sizes of the channel sections for the cooling liquid in the return pipe 17 and the second passage portion 63 are secured, the occupation area which these components occupy on the mother board 3 can be reduced. Namely, the mounting space for the other mounting components to be mounted on the mother board 3 can be sufficiently secured.

Figure 15:
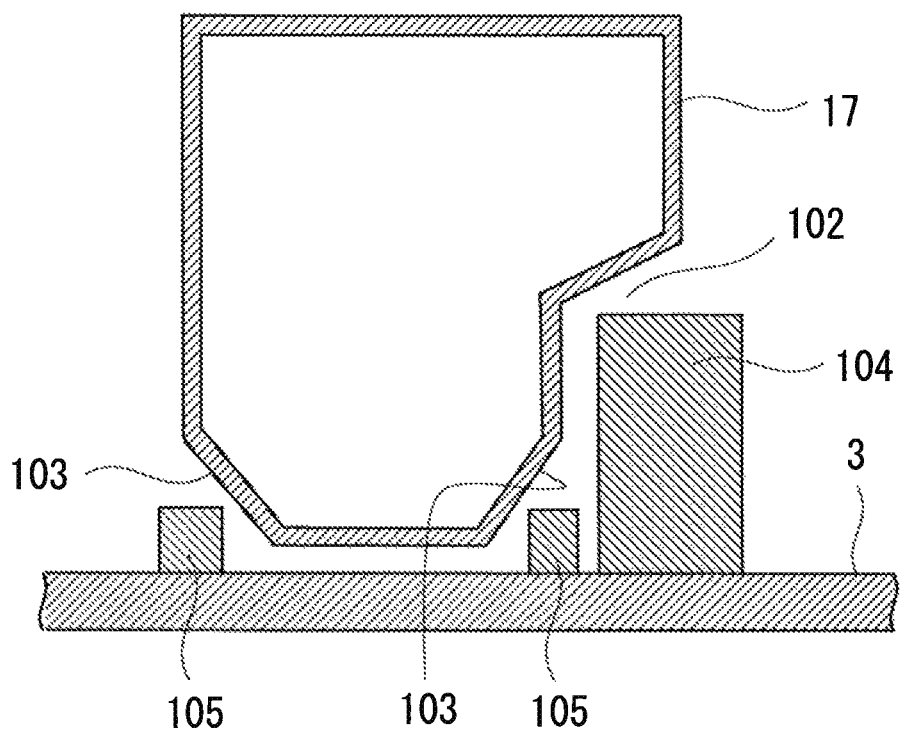
FIG. 15 is a view schematically illustrating a shape of the return pipe according to embodiment 1.

For example, as in the schematic view illustrated in FIG. 15, a cutout space 102 is formed at a side of the return pipe 17 by making the breadth of the lower side smaller as compared with the upper side of the return pipe 17, and a lower end edge portion of the return pipe 17 is further chamfered, whereby a chamfered edge portion 103 may be formed. As in an example illustrated in FIG. 15, an electronic component 104 may be mounted on the mother board 3 so that at least a part of the electronic component 104 burrows (enters) into the cutout space 102. An electronic component 105 which is shorter than the electronic component 104 which is disposed in the cutout space 102 may be disposed in an opening space that is formed between the chamfered edge portion 103 and the mother board 3. According to this, the lower space of the return pipe 17 can be effectively used as a mounting space for the electronic components 104 and 105. Note that the electronic components 104 and 105 are, for example, capacitors or the like, but are not limited thereto.

Figure 16:
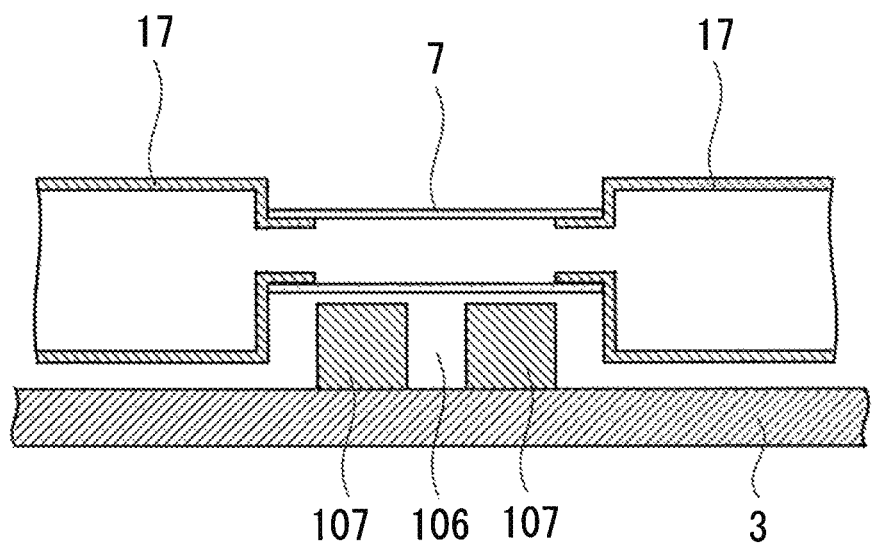
FIG. 16 is a view schematically illustrating a positional relationship of a flexible tube and electronic components according to embodiment 1.

Further, in the electronic equipment 1 according to the present embodiment, a space under the flexible tube 7 which is disposed at the connecting portion of the respective return pipes 17 can be used as a mounting space for electronic components. For example, as in a schematic view illustrated in FIG. 16, a space 106 that is formed at a lower portion of the flexible tube 7 (namely, a space between the flexible tube 7 and the mother board 3) is effectively used, and an electronic component 107 can be mounted on the mother board 3. Further, from the similar viewpoint to the above description, a space between the flexible tube 8 disposed at the connecting portion of the radiator module 12 and the return pipe 17 and the mother board 3 may be used as a mounting space for electronic components.

Incidentally, when circulation of the cooling liquid in the circulation passage stops for some reason, for example, due to a failure of the pump 15, or the cooling liquid is not cooled due to a failure of the blower fan 18, the possibility is conceivable that the cooling liquid is boiled by the absorbed heat from the CPU 4. In this case, boiling of the cooling liquid is assumed to be remarkable in the first internal channel 65 and the second internal channel 66 of the cooling plate 61 which thermally contacts the CPU 4. As a result, the flexible tubes 5 to 8 are expanded due to rise in the pressure in the circulation passage in the cooling unit 10, and it is feared that these flexible tubes result in breakage under certain circumstances.

Accordingly, in the cooling unit 10, a fail-safe design for restraining the flexible tubes 5 to 8 from being ruptured even when the cooling liquid in the circulation passage boils due to the failure of the pump 15 or the blower fan 18, is made.

As a first fail-safe mechanism, for any of the flexible tubes of the cooling unit 10, a fastening force of at least any one of the tube bands which fasten both end portions thereof is set to be lower as compared with the other flexible tube. Here, the tube band the fastening force of which is set to be relatively low as compared with the other flexible tubes is called "fastening reduced tube band". For example, the fastening force of the fastening reduced tube band may be set so that the flexible tube is opened to the atmosphere, before an internal pressure in the circulation passage of the cooling unit 10 exceeds a predetermined allowable pressure. In more detail, the fastening force of the fastening reduced tube band may be set so that the flexible tube is opened to the atmosphere at a time point when the internal pressure of the circulation passage rises to a reference pressure. Here, the flexible tube at which the fastening reduced tube band is disposed is called "tube to be opened at abnormal time". Further, the tube to be opened at abnormal time may be opened to the atmosphere before the internal pressure in the circulation passage exceeds an allowable pressure by fitting no tube band at one end portion in the tube to be opened at abnormal time.

Note that in the cooling unit 10, the flexible tube at any one spot may be set as the tube to be opened at abnormal time. If the flexible tube which is set as the tube to be opened at abnormal time is opened to the atmosphere, the internal pressure of the entire circulation passage is reduced. Incidentally, when the cooling water in the circulation passage boils due to a failure of the pump 15, the blower fan 18 or the like, rise in the internal pressure of the flexible tube 6 which is the nearest to the cooling plate 61 out of the flexible tubes 5 to 8 easily becomes remarkable. Therefore, the flexible tube 6 is considered to be the most likely to reach rupture among the flexible tubes 5 to 8.

Therefore, among the flexible tubes 5 to 8, the flexible tube 6 which easily becomes a weak point may be set as the tube to be opened at abnormal time. Thereby, the flexible tube 6 which easily becomes a weak point can be prevented from being ruptured. However, nothing prevents the fastening reduced tube bands from being disposed at the flexible tubes at a plurality of spots. Further, in the above described example, the case of disposing the fastening reduced tube band at one end portion of the tube to be opened at abnormal time is described, but the fastening reduced tube bands may be disposed at both the end portions.

Next, as a second fail-safe mechanism, protecting members that restrain expansion deformation by covering outer peripheries of the flexible tubes 5 to 8 and arresting the tubes may be attached on the flexible tubes 5 to 8. The protecting members are not limited to specific members, but may be, for example, tube-shaped members that cover the outer peripheries of the flexible tubes 5 to 8, wire members that are wound around the outer peripheries of the flexible tubes 5 to 8 or the like. According to this, when the internal pressure of the circulation passage rises due to a failure of the pump 15, the blower fan 18 or the like, the protecting members restrain the flexible tubes 5 to 8 from excessively expanding, and can inhibit rupture thereof. Note that the end portions of the flexible tubes 5 to 8 may be bonded to the nozzles in which the end portions are fitted, by an adhesive or the like. In this case, when the pump 15, the blower fan 18 or the like fails, the connecting portions between the flexible tubes 5 to 8 and the nozzles come off, whereby the flexible tubes 5 to 8 are opened to the atmosphere. As a result, the internal pressure of the circulation passage in the cooling unit 10 can be restrained from excessively rising.

From the above, according to the fail-safe mechanisms in the cooling unit 10, even when the pump 15, the blower fan 18 or the like fails, the flexible tubes 5 to 8 can be restrained from being ruptured. Therefore, the situation can be avoided, in which such explosive sound as gives anxiety to the operator of the electronic equipment 1 occurs.

Figure 17:
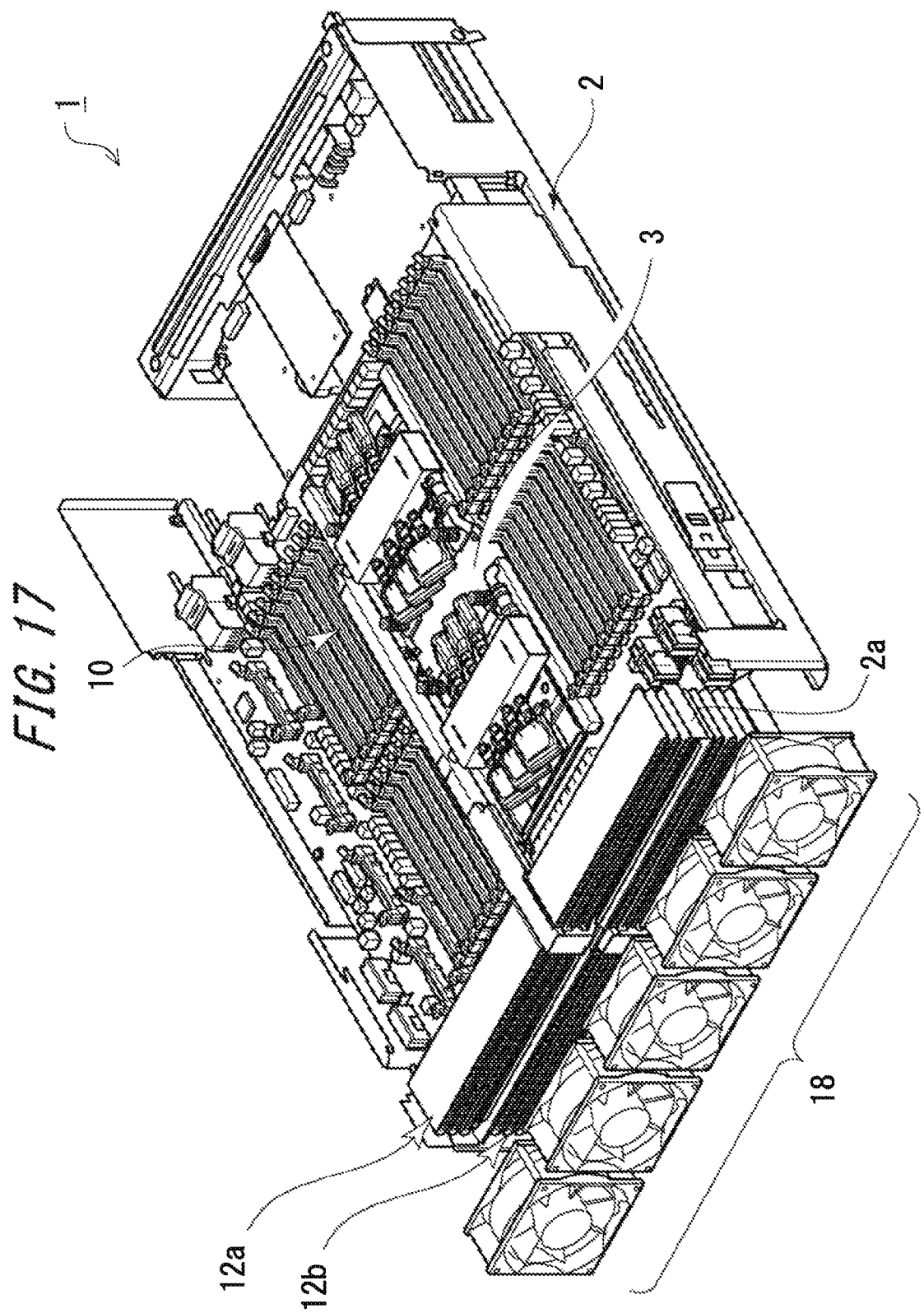
FIG. 17 is a perspective view of electronic equipment according to a modification example of embodiment 1.

Note that in the cooling unit 10 of the present embodiment, the numbers of the heat receiving modules 16 and the pump modules 11 correspond to the number of the CPUs 4 which are heat-generating components. In the present embodiment, the number of the CPUs 4 which are provided in the electronic equipment 1 is two, and therefore, the cooling units 10 includes two of the heat receiving modules 16 and two of the pump modules 11 respectively. The numbers of the modules are increased or decreased in accordance with the number of the CPUs 4 which are included in the electronic equipment 1. Further, in the casing 2, the mother boards 3 may be disposed in multiple stages. For example, in the electronic equipment 1 illustrated in FIG. 17, the mother boards 3 are disposed in two stages, and for each of the mother boards 3, the cooling unit 10 described above is disposed. Here, reference numerals and symbols 12a and 12b represent radiator modules corresponding to the respective cooling units 10. As illustrated, the radiator modules 12a and 12b are disposed vertically in multiple stages. In the casing 2, an insert plate 2a that holds the radiator module 12a which is disposed on the upper stage is provided. The radiator module 12a on the upper stage can be fixed to the insert plate 2a by the radiator holding member 24.

Embodiment 2

Figure 18:
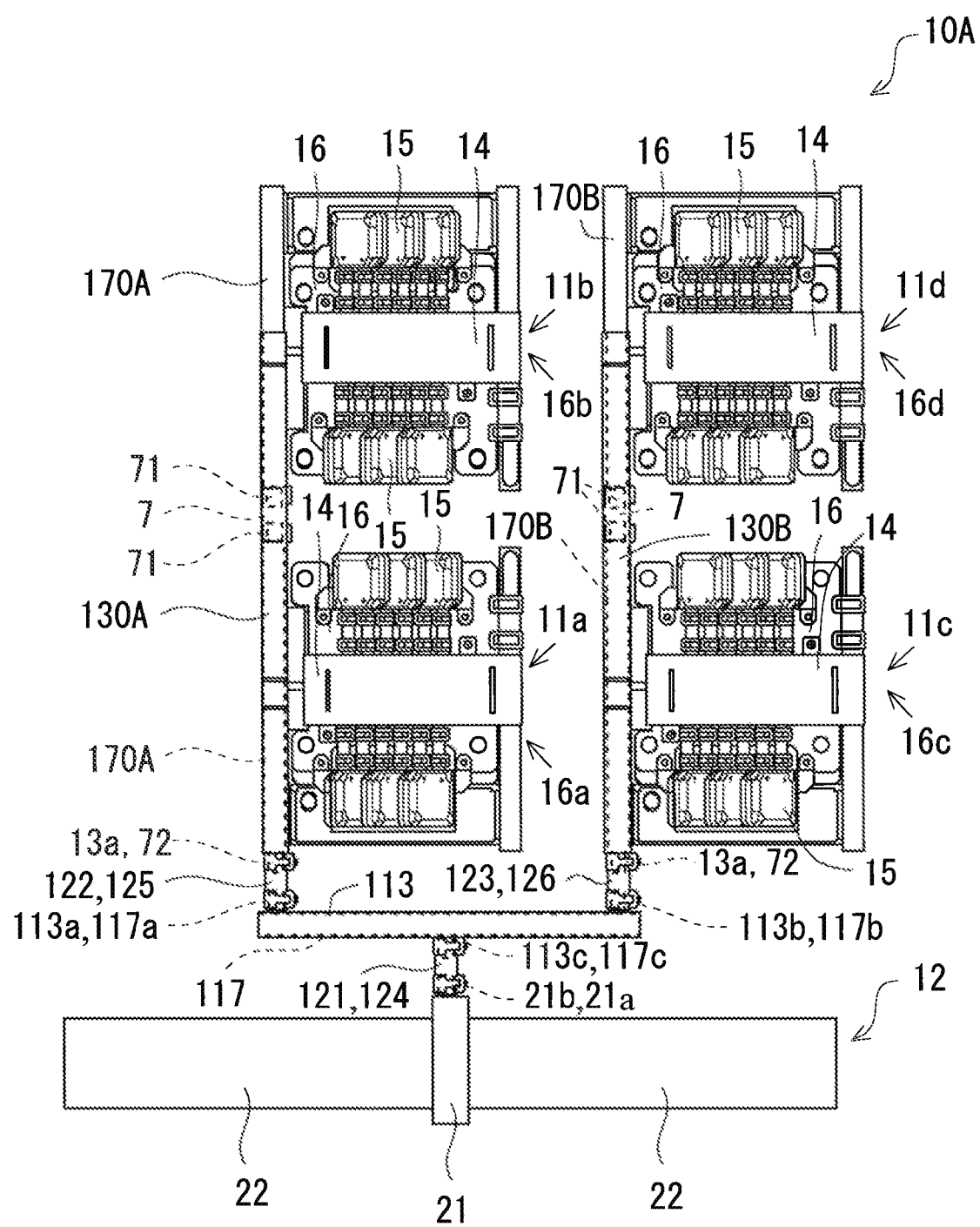
FIG. 18 is a top view of a cooling unit according to embodiment 2.
Figure 19:
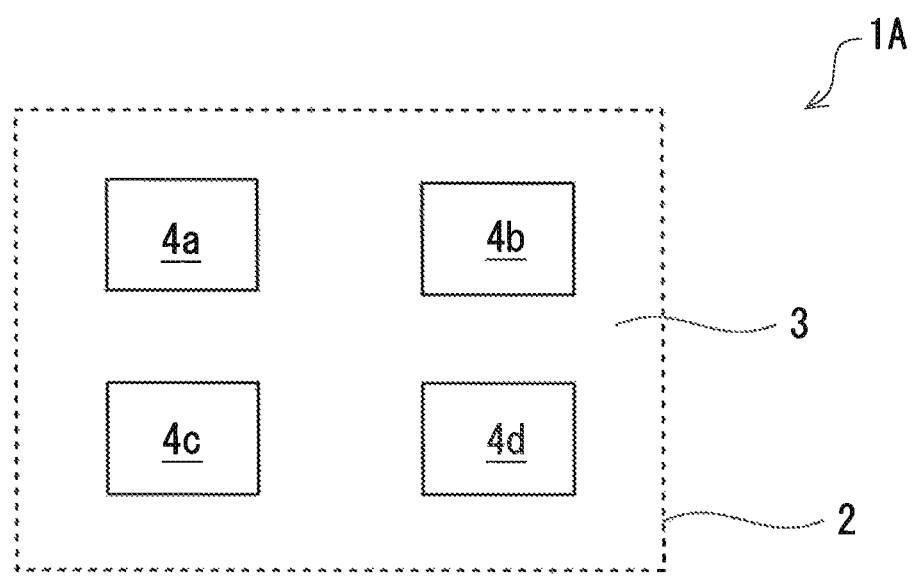
FIG. 19 is a schematic diagram of electronic equipment according to embodiment 2.

FIG. 18 is a top view of a cooling unit 10A according to embodiment 2. In the cooling unit 10A, the members common to the cooling unit 10 according to embodiment 1 are assigned with the same reference numerals and symbols, and thereby, the detailed description will be omitted. In electronic equipment 1A to which the cooling unit 10A according to the present embodiment is applied, four CPUs are loaded on the mother board 3 as illustrated in a schematic diagram of FIG. 19. Hereinafter, the four CPUs are called a first to a fourth CPU 4a, 4b, 4c and 4d.

The cooling unit 10A has the radiator module 12, the pump module 11, the heat receiving module 16, the feeding pipe 13, the return pipe 17, a common feeding pipe 113, a common return pipe 117 and the like. Here, the heat receiving modules which are provided to correspond to the respective CPUs 4a to 4d are called a first to a fourth heat receiving modules 16a, 16b, 16c and 16d. Further, pump modules provided to correspond to the respective CPUs 4a to 4d are called a first to a fourth pump modules 11a, 11b, 11c and 11d.

In the cooling unit 10A, the common feeding pipe 113 and the common return pipe 117 are connected to the radiator module 12. The common feeding pipe 113 and the common return pipe 117 are disposed as a vertical two-stage structure, and the common feeding pipe 113 is disposed to be overlaid on the common return pipe 117. In FIG. 18, an outer shape of the common return pipe 117 is illustrated by a broken line. The common feeding pipe 113 is connected to the discharge nozzle 21b of the connecting portion 21 in the radiator module 12. Meanwhile, the common return pipe 117 is connected to the inflow nozzle 21a of the connecting portion 21.

The common feeding pipe 113 is a branch pipe for supplying the cooling liquid cooled by the radiator module 12 to the respective pump modules 11 and heat receiving modules 16. Further, the common return pipe 117 is a merging pipe for merging the cooling liquids recovered from the respective pump modules 11 and heat receiving modules 16 with one another and thereafter guiding the cooling liquid to the radiator module 12.

In the common feeding pipe 113, a first discharge nozzle 113a is formed at one end portion side of one side surface along a longitudinal direction, and a second discharge nozzle 113b is formed at the other end portion side. Further, an inflow nozzle 113c is formed in a vicinity of a central portion in the longitudinal direction, of a side surface at an opposite side from the first discharge nozzle 113a and the second discharge nozzle 113b. Further, in the common return pipe 117, a first inflow nozzle 117a is formed at one end portion side of one side surface along the longitudinal direction, and a second inflow nozzle 117b is formed at the other end portion side. Further, a discharge nozzle 117c is formed in a vicinity of a central portion in the longitudinal direction, of a side surface at an opposite side from the first inflow nozzle 117a and the second inflow nozzle 117b.

When the cooling unit 10A is seen from above, the first discharge nozzle 113a, the second discharge nozzle 113b and the inflow nozzle 113c of the common feeding pipe 113 correspond to the first inflow nozzle 117a, the second inflow nozzle 117b and the discharge nozzle 117c of the common return pipe 117, respectively. Namely, the first discharge nozzle 113a and the first inflow nozzle 117a, the second discharge nozzle 113b and the second inflow nozzle 117b, and the inflow nozzle 113c and the discharge nozzle 117c are respectively disposed vertically in layer.

The inflow nozzle 113c of the common feeding pipe 113 is connected to the discharge nozzle 21b of the radiator module 12 to be relatively displaceable from each other, via a flexible tube 121 having flexibility. Further, the first discharge nozzle 113a of the common feeding pipe 113 is connected to the inflow nozzle 13a of a feeding pipe (hereinafter, called "first feeding pipe") 130A to be relatively displaceable from each other via a flexible tube 122 having flexibility. Further, the second discharge nozzle 113b of the common feeding pipe 113 is connected to the inflow nozzle 13a of a feeding pipe (hereinafter, called "second feeding pipe") 130B to be relatively displaceable from each other via a flexible tube 123 having flexibility.

Meanwhile, the discharge nozzle 117c of the common return pipe 117 is connected to the inflow nozzle 21a of the radiator module 12 to be relatively displaceable from each other via a flexible tube 124 having flexibility. Further, the first inflow nozzle 117a of the common return pipe 117 is connected to the discharge nozzle 72 of a return pipe (hereinafter, called "first return pipe") 170A to be relatively displaceable from each other via a flexible tube 125 having flexibility. Further, the second inflow nozzle 117b of the common return pipe 117 is connected to the discharge nozzle 72 of a return pipe (hereinafter, called "second return pipe") 170B to be relatively displaceable from each other via a flexible tube 126 having flexibility. Note that the flexible tubes 121 to 126 are the members equivalent to the flexible tubes 5 to 8 described above, and have elastic deformability. Further, both end portions of each of the flexible tubes 121 to 126 are fastened by tube bands equivalent to the tube bands in embodiment 1.

In the cooling unit 10A in embodiment 2, the cooling liquid which is cooled by the radiator module 12 is distributed to the first feeding pipe 130A and the second feeding pipe 130B respectively by the common feeding pipe 113. Here, the first and the second pump modules 11a and 11b and the first and the second heat receiving modules 16a and 16b are connected to the first feeding pipe 130A, and the first and the second CPUs 4a and 4b are cooled by the cooling liquid which is supplied via these modules. The cooling liquid which is discharged from the first and the second heat receiving modules 16a and 16b is recovered to the radiator module 12 after passing through the first return pipe 170A and the common return pipe 117.

Meanwhile, the third and the fourth pump modules 11c and 11d, and the third and the fourth heat receiving modules 16c and 16d are connected to the second feeding pipe 130B, and the third and the fourth CPU 4c and 4d are cooled by the cooling liquid which is supplied via these modules. The cooling liquid which is discharge from the third and the fourth heat receiving modules 16c and 16d returns to the radiator module 12 after passing through the second return pipe 170B and the common return pipe 117.

In the cooling unit 10A according to the present embodiment, the heat receiving modules 16 and the pump modules 11 are disposed to correspond to the respective CPUs 4, and the suitable common feeding pipe 113 and common return pipe 117 can be prepared in response to the disposition form of the respective modules. In the cooling unit 10A in the present embodiment, the case in which the number of branches of the channel for the cooling liquid which is branched to the respective pipes 13 from the common feeding pipe 113 is set as two is described, but the number of branches can be changed in response to the disposition form of the CPUs 4 on the mother board 3. Similarly, in the cooling unit 10A according to the present embodiment, the case in which the number of merges of the channels for the cooling water which are merged from the respective return pipes by the common return pipe 117 is set as two is described, but the number of merges can be changed in response to the disposition form of the CPUs 4 on the mother board 3.

As above, when the pump module 11 and the heat receiving module 16 are connected in parallel, the common feeding pipe 113 and the common return pipe 117 are connected to the radiator module 12, whereby the cooling unit 10A can be constructed by using the common modules. Thereby, the cooling unit 10A which can flexibly respond to change of the number of the CPUs 4 and the disposition pattern can be made. Further, the capacity of the connecting portion 21 of the radiator module 12 and the number of attached tube channels 22 can be properly increased or decreased in accordance with the number of the CPUs 4 which are cooled by the cooling unit 10A.

Various modifications can be added to the embodiments described above within the range without departing from the gist of the present invention. Further, the aforementioned embodiments and the modification examples can be carried out by being combined with one another as much as possible.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A cooling unit that cools a plurality of heat-generating components in electronic equipment, comprising:
   a radiator;
   a supply pipe which is connected to the radiator, and in which a refrigerant that is air-cooled by the radiator flows;
   a plurality of open nozzles provided at the supply pipe to correspond to the respective plurality of heat-generating components;
   a plurality of heat receiving units that are mounted to the respective plurality of heat-generating components and connected to the respective open nozzles, and allow a refrigerant supplied from the open nozzles to flow through internal channels; and
   a plurality of return pipes each of which is provided for each of the heat receiving units and joined to the heat receiving unit, and returns the refrigerant discharged from the heat receiving unit to the radiator,
   wherein the respective heat receiving units are connected to the supply pipe to be relatively displaceable, and
   the respective return pipes are connected to one another in series and relatively displaceably.

2. The cooling unit according to claim 1,
   wherein each in a connecting portion between the heat receiving unit and the supply pipe and in a connecting portion between the return pipes, a connecting pipe having flexibility is interposed.

3. The cooling unit according to claim 1,
   wherein the supply pipe is connected to the radiator to be relatively displaceable, and
   the return pipe which is located most downstream out of the plurality of return pipes is connected to the radiator to be relatively displaceable.

4. The cooling unit according to claim 3,
   wherein each in a connecting portion between the supply pipe and the radiator and in a connecting portion between the return pipe and the radiator, a connecting pipe having flexibility is interposed.

5. The cooling unit according to claim 4, further comprising:
   a radiator holding member that is attached on the radiator and the supply pipe across the connecting pipe.

6. The cooling unit according to claim 1,
   wherein the supply pipe includes at least one of an internal channel of a tank, and an internal channel of a pump.

7. Electronic equipment, comprising:
   a plurality of heat-generating components; and
   a cooling unit that cools the plurality of heating components,
   wherein the cooling unit has
   a radiator,
   a supply pipe which is connected to the radiator, and in which a refrigerant that is air-cooled by the radiator flows,
   a plurality of open nozzles provided at the supply pipe to correspond to the respective plurality of heat-generating components,
   a plurality of heat receiving units that are mounted to the respective plurality of heat-generating components and connected to the respective open nozzles, and allow a refrigerant supplied from the open nozzles to flow through internal channels, and
   a plurality of return pipes each of which is provided for each of the heat receiving units and joined to the heat receiving unit, and returns the refrigerant discharged from the heat receiving unit to the radiator, the respective heat receiving units are connected to the supply pipe to be relatively displaceable, and the respective return pipes are connected to one another in series and relatively displaceably.

8. The electronic equipment according to claim 7, wherein each in a connecting portion between the heat receiving unit and the supply pipe and in a connecting portion between the return pipes, a connecting pipe having flexibility is interposed.

9. The electronic equipment according to claim 7, wherein the supply pipe is connected to the radiator to be relatively displaceable, and the return pipe which is located the most downstream out of the plurality of return pipes is connected to the radiator to be relatively displaceable.

10. The electronic equipment according to claim 9, wherein each in a connecting portion between the supply pipe and the radiator and in a connecting portion between the return pipe and the radiator, a connecting pipe having flexibility is interposed.

11. The electronic equipment according to claim 10, further comprising:

a radiator holding member that is attached on the radiator and the supply pipe across the connecting pipe.

12. The electronic equipment according to claim 7, wherein the supply pipe includes at least one of an internal channel of a tank, and an internal channel of a pump.

\* \* \* \* \*